US010515649B2

United States Patent
Mittal et al.

(10) Patent No.: US 10,515,649 B2
(45) Date of Patent: *Dec. 24, 2019

(54) METHOD FOR CODING PULSE VECTORS USING STATISTICAL PROPERTIES

(71) Applicant: Google Technology Holdings LLC, Mountain View, CA (US)

(72) Inventors: Udar Mittal, Rolling Meadows, IL (US); James P. Ashley, Naperville, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 221 days.

This patent is subject to a terminal disclaimer.

(21) Appl. No.: 15/588,278

(22) Filed: May 5, 2017

(65) Prior Publication Data

US 2017/0263262 A1 Sep. 14, 2017

Related U.S. Application Data

(63) Continuation of application No. 14/460,452, filed on Aug. 15, 2014, now Pat. No. 9,672,838.

(51) Int. Cl.
*H04N 19/94* (2014.01)
*G10L 19/038* (2013.01)
*H03M 7/30* (2006.01)

(52) U.S. Cl.
CPC ......... *G10L 19/038* (2013.01); *H03M 7/3082* (2013.01); *H04N 19/94* (2014.11)

(58) Field of Classification Search
CPC . G10L 19/038; H03M 7/3082; H03M 7/4012; H04N 19/91; H04N 19/94
See application file for complete search history.

(56) References Cited

U.S. PATENT DOCUMENTS

| | | | | |
|---|---|---|---|---|
| 4,578,704 A | * | 3/1986 | Gharavi | H04N 19/50 341/107 |
| 6,236,960 B1 | * | 5/2001 | Peng | G10L 19/10 704/201 |

(Continued)

FOREIGN PATENT DOCUMENTS

WO 0111610 A1 2/2001

OTHER PUBLICATIONS

Udar Mittal et al: "Coding pulse sequences using a combination of factorial pulse coding and arithmetic coding", Signal Processing and Communications (SPCOM), 2010 International Conference on, IEEE, Piscataway, NJ, USA, Jul. 18, 2010 (Jul. 18, 2010), pp. 1-5.*

(Continued)

*Primary Examiner* — Mohammed S Rahaman
(74) *Attorney, Agent, or Firm* — Brake Hughes Bellermann LLP

(57) ABSTRACT

Improved methods for coding an ensemble of pulse vectors utilize statistical models (i.e., probability models) for the ensemble of pulse vectors, to more efficiently code each pulse vector of the ensemble. At least one pulse parameter describing the non-zero pulses of a given pulse vector is coded using the statistical models and the number of non-zero pulse positions for the given pulse vector. In some embodiments, the number of non-zero pulse positions are coded using range coding. The total number of unit magnitude pulses may be coded using conditional (state driven) bitwise arithmetic coding. The non-zero pulse position locations may be coded using adaptive arithmetic coding. The non-zero pulse position magnitudes may be coded using probability-based combinatorial coding, and the corresponding sign information may be coded using bitwise arithmetic coding. Such methods are well suited to coding non-inde- (Continued)

pendent-identically-distributed signals, such as coding video information.

17 Claims, 10 Drawing Sheets

(56) References Cited

U.S. PATENT DOCUMENTS

| | | |
|---|---|---|
| 6,662,154 B2 | 12/2003 | Mittal et al. |
| 6,900,748 B2 | 5/2005 | Marpe et al. |
| 7,230,550 B1 | 6/2007 | Mittal et al. |
| 7,461,106 B2 | 12/2008 | Mittal et al. |
| 7,889,103 B2 | 2/2011 | Mittal et al. |
| 7,978,101 B2 | 7/2011 | Mittal et al. |
| 8,149,144 B2 | 4/2012 | Mittal et al. |
| 8,207,875 B2 | 6/2012 | Ashley et al. |
| 2003/0103766 A1* | 6/2003 | Sugahara ............ G11B 27/036 386/337 |
| 2003/0110027 A1* | 6/2003 | Mittal ................. G06T 9/005 704/219 |
| 2004/0002856 A1 | 1/2004 | Bhaskar et al. |
| 2005/0069035 A1 | 3/2005 | Lu et al. |
| 2005/0171771 A1* | 8/2005 | Yasunaga ............ G10L 19/083 704/219 |
| 2010/0049511 A1* | 2/2010 | Ma ...................... G10L 19/08 704/221 |
| 2011/0096830 A1 | 4/2011 | Ashley et al. |
| 2011/0156932 A1 | 6/2011 | Mittal et al. |
| 2012/0029923 A1 | 2/2012 | Rajendran et al. |
| 2012/0029925 A1* | 2/2012 | Duni .................... G10L 19/038 704/500 |
| 2013/0034168 A1 | 2/2013 | Fukui et al. |
| 2013/0148749 A1* | 6/2013 | Mittal .................. G10L 19/038 375/259 |

OTHER PUBLICATIONS

Ashley J P et al: "Wideband coding of speech using a scalable pulse codebook", Speech Coding, 2000. Proceedings. 2000 IEEE Workshop on Sep. 17-20, 2000, Piscataway, NJ, USA,IEEE, Sep. 17, 2000 (Sep. 17, 2000), pp. 148-150.*

Ashley, et al., "Wideband Coding of Speech Using a Scalable Pulse Codebook", 2000 IEEE Workshop on Speech Coding, Sep. 17-20, 2000, pp. 148-450.

Fischer, "A Pyramid Vector Quantizer", IEEE Transactions on Information Theory, vol. 32, No. 4, Jul. 1986, 16 pages.

Hung, et al., "Error-Resilient Pyramid Vector Quantization for Image Compression", IEEE Transactions on Image Processing, vol. 7, No. 10, Oct. 1998, 14 pages.

Hung, et al., "Multidimensional Rotations for robust quantization of image data", IEEE Transaction on Image Processing, vol. 7, No. 1, Jan. 1998, 12 pages.

Mittal, "Coding Pulse Sequences Using a Combination of Factorial Pulse Coding and Arithmetic Coding", IEEE 2010 International Conference on Signal Processing and Communications,, Jul. 18, 2010, 5 pages.

International Preliminary Report on Patentability for PCT Application No. PCT/US2015/043939, dated Mar. 2, 2017, 11 Pages.

* cited by examiner

METHOD FOR CODING PULSE VECTORS USING STATISTICAL PROPERTIES

CROSS-REFERENCE TO RELATED APPLICATIONS

This application is a Continuation of, and claims priority to, U.S. patent application Ser. No. 14/460,452, filed on Aug. 15, 2014, entitled "METHOD FOR CODING PULSE VECTORS USING STATISTICAL PROPERTIES", the disclosure of which is incorporated by reference herein in its entirety.

The following applications of common assignee contain related subject matter and are hereby incorporated by reference: Application Ser. No. 14/460,464, now U.S. Pat. No. 9,336,788, entitled METHOD FOR CODING PULSE VECTORS USING STATISTICAL PROPERTIES; Application Ser. No. 14/460,440, filed Aug. 15, 2014, entitled METHOD FOR CODING PULSE VECTORS USING STATISTICAL PROPERTIES; and Application Ser. No. 14/460,477, now U.S. Pat. No. 9,620,136, entitled METHOD FOR CODING PULSE VECTORS USING STATISTICAL PROPERTIES.

TECHNICAL FIELD

This application is related to encoding and decoding of video signals. More particularly, this application is related to encoding and decoding pulse vectors, which represent portions of a video frame, using statistical analysis of the pulse vectors.

BACKGROUND

Recently, a general method for coding integerized pulse sequences (similar to linear PCM signals) that are present in many audio and speech compression systems has been established. The method, referred to as Factorial Pulse Coding or FPC, overcomes some of the technical limitations associated with combinatorial coding of audio signal vectors, most notably the high computational complexity associated with implementing high order factorial expressions involving N-choose-K type combinatorial operations.

It is noted that unlike audio, video resolutions continue to grow. Also, unlike audio, the bandwidth requirements for both the transmission and the storage of video information increases in a manner that is proportional to the product of the horizontal and vertical resolution of a video display. This is important not only to content providers and video services (e.g., YouTube® and Netflix®), but also wireless service providers and device manufacturers, where high definition video displays have become commonplace. Thus, the importance of efficient video signal coding in the communications industry continues to rise.

Thus, what is needed is a method for encoding and decoding video signals in a more efficient, compact manner, that uses some aspects of the benefits of FPC, but is further adapted and configured to operate efficiently with various video codecs and provide more efficient coding of the video signal.

BRIEF DESCRIPTION OF THE DRAWINGS

For a more complete understanding, reference is now made to the following description taken in conjunction with the accompanying drawings in which.

DETAILED DESCRIPTION

Figure 1:
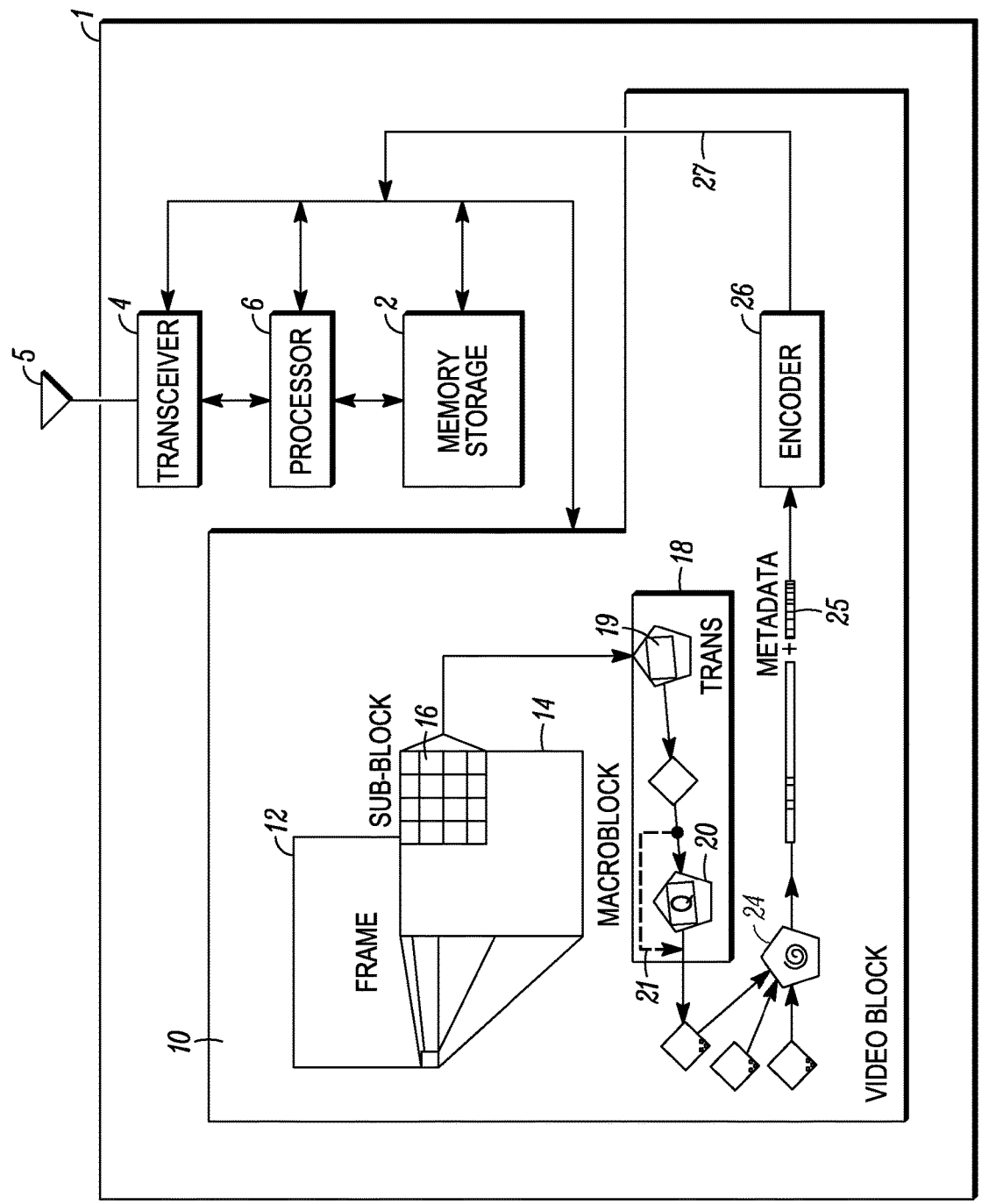
FIG. 1 is a block diagram and functional flow diagram of a user equipment (UE) incorporating an embodiment of the method for coding pulse vectors using statistical and probability properties.

Referring now to the drawings, wherein like reference numbers are used herein to designate like elements throughout, the various views and embodiments of the method for coding pulse vectors using statistical properties are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Additionally, before describing in detail embodiments that are in accordance with the present invention, it should be observed that the embodiments reside primarily in combinations of method steps and apparatus components related to digital video encoding and decoding in order to decrease the necessary bandwidth required in communication of such digital video signals. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description and figures provided herein.

As an overview of Factorial Pulse Coding (FPC), FPC is a technology developed use in coding audio sequences. Although developed for audio compression applications, FPC generally works for any quantized independent and identically distributed (i.i.d.) Laplacian random signal x, that follows the basic constraint:

$$m = \sum_{i=0}^{n-1} |x_i|, \quad (1)$$

where $x=\{x_0, x_1, \ldots, x_{n-1}\}$ is a quantized signal vector containing integer values, n is the vector length, and m is the total number of unit magnitude "pulses" within vector x, such that all vector elements are within the range $-m \leq x_i \leq m$. It has been found that the total number of unique pulse combinations N in a video frame arising from Eq.1 is:

$$N = \sum_{k=1}^{min(m,n)} F(n, k)D(m, k)2^k, \quad (2)$$

where F(n,k) is the number of combinations of k non-zero elements on n vector positions:

$$F(n, k) = \frac{n!}{k!(n-k)!}, \quad (3)$$

D(m,k) is the number of combinations that m unit magnitude pulses can fall on k non-zero vector elements, (where $k \leq m$):

$$D(m, k) = F(m-1, k-1) = \frac{(m-1)!}{(k-1)!(m-k)!}, \quad (4)$$

and $2^k$ is the number of unique sign combinations for the k non-zero vector positions. Given the total number of combinations N, and that each of the N combinations is equiprobable, then the total number of bits M required to code the vector sequence x is:

$$M = \log_2(N).$$

As one may observe, the number of combinations N (and corresponding number of bits M) can become quite large even for modest values of n and m.

There exists a method called Pyramid Vector Quantization (PVQ), which is a method proposed for coding Laplacian random variables using a constraint of the form given in Eq.1. Further use of PVQ in audio compression has emerged more recently in the open-source codec Opus, which is based partly on the CELT codec. In addition, a new open-source video codec code-named "Daala" uses a variation on PVQ.

While the fundamental constraint given in Eq.1 is common to both FPC and PVQ, it is important to understand that the primary differences between FPC and PVQ lie in the enumeration algorithms, and the ability of FPC to operate with much higher values of m and n while maintaining the minimum number of bits for coding. As such, the PVQ method generally uses ranges of m and n that can generally fit within a 32-bit operand. Conversely, and as eluded to above, FPC can scale up to hundreds, or even thousands of bits, while growing only linearly in computational complexity. FPC has been found by the inventors to also be useful in very high order systems, including applications for coding high-resolution transform domain coefficients, where codeword fields may contain hundreds (or thousands) of bits. FPC has also been included in the following industry standards for audio: 3GPP2 EVRC-B and EVRC-WB, and ITU-T G.718. In these standards, low-complexity fixed-point software implementations are required as part of the distribution packages. Thus, the primary technical advantages of FPC over PVQ are:

1) Scalability to large values of n and m, and
2) The ability to do so while maintaining low computational complexity.

To evaluate use of FPC in video, an FPC bit rate estimator (given in Eqs.1-5) was "plugged" into an existing video codec. Then, while keeping video quality constant, the incremental bit rate of FPC relative to the default coding method was measured (for the default coding method used by video codec). Only the bits used by the default video codec for which the equivalent FPC operations are performed were counted. By keeping the video quality constant (i.e., bit exact with the default codec operations), one can focus on the bit rate aspects, and not be concerned with trying to measure relative quality differences. Maintaining bit-exactness, however, does create other codec specific issues, which will be discussed below.

Referring to FIG. 1, an example of a mobile communication device, electronic tablet device, video creation/playback device or other user equipment (UE) 1 having a user interface (not specifically shown) is depicted. The UE 1 has a video block 10 comprising hardware and/or software blocks adapted to encode or decode a digital video signal. As is well known in the art, digital video signals may be divided into a plurality of frames. Often the frames are of different frame types, which are utilized to compensate for motion and at the same time decrease the bit-rate needed to transmit the motion representation within areas of the frame to a decoder. In general there are I, B and P coded fields or frames of data in a digital video signal, which are well known in the art. Embodiments of the invention work equally well for each of the various types of I, B and P data fields or data frames of video data.

Here in FIG. 1, within the video block 10 is a block diagram that represents a high level view of a video codec that may incorporate a Video FPC (FPC) in accordance with various embodiments. A frame of data 12, which is essentially a spatial domain snapshot of a video screen (a single video frame), is divided into multiple macro blocks 14 in the form of a grid or matrix. Each macro block 14 can be, for example, 32×32 pixels in dimension. In various embodiments each macro block may be sectioned into 64 ×64, 32×32, 16×16 or 8×8 pixels. The macro blocks 14 may be further subdivided into sub blocks 16, which may be for example, 8×8 or 4×4 pixels.

Each of the sub blocks 16 are provided as an array of data to a transform block 18. In some embodiments the transform block 18 performs a discrete cosine transform (DCT) 19 on each of the sub blocks 16, which converts the X Y coordinate system of each sub block into a spatial-frequency domain. The DCT 19 outputs transform coefficients. The transform coefficients are then quantized in the quantization block 20.

In other embodiments, different transforms may be performed on each of the sub blocks 16. For example, a Walsh-Hadamard transform (WHT) can be used instead of the DCT 19. When a WHT block is used, the transform coefficients generated by the transform are already quantized, thus the quantization block 20 is not required and can be bypassed as shown by the dotted lines 21. In other embodiments, when lossless coding of the sub blocks 16 is used, the quantization step may have little or no effect on the transform coefficients produced in the transform regardless of whether a DCT is used or not.

After the transform block 18, in some embodiments, the 4×4 or 8×8 blocks of quantized coefficients that were output from the transform block 18, are converted from a two dimensional matrix to a serial string of quantized coefficients. In various embodiments this is performed by scanning the matrix in, for example, a zigzag pattern, as is also known in the art, to turn the 2D matrix into a serial string of quantized coefficients, which may also be referred to as a quantized pulse vector. The serial strings of quantized coefficients may then be provided to a loop filter block 24, which may, among other things, buffer the serial string of quantized coefficients due to a varying bit-rate that is dependent on the complexity of the picture information (e.g., the type of frame data I, B or P frame data) and the amount and type of motion captured in the digital video frame.

The output of the loop filter block 24 provides a quantized pulse vector x that contains only integer valued magnitude components which embodiments of a Video FPC encoder 26 requires. (The quantized pulse vector x may also be referred to herein as a pulse vector.) The pulse vector x, in some embodiments, may also contain information indicating the length n of the pulse vector. The Video FPC encoder 26 receives the pulse vector x and the vector length n. It should be noted that the pulse vector may also include or have attached thereto meta data 25 associated with the frame or the overall video data. The Video FPC encoder 26 may be configured to have a predetermined number of number unit magnitude pulses m (as in various audio applications) for each pulse vector x, or the number unit magnitude pulses m can be calculated from the pulse vector x signal itself. Conversely, on the decoder side, however, if m is not fixed, it must be conveyed as side information, either by explicit coding or indirectly by coding block energies from which the number of bits m can be derived. Once the number of bits is made available, the number of magnitude pulses m can be determined from there.

In various embodiments, the Video FPC encoder 26 combines statistical encoding with vector quantization to provide coded video that requires less data and bandwidth than prior video encoding and decoding methods. The coded video output of the Video FPC encoder 26 can then be stored in a memory or data storage device 2, or transmitted wirelessly via a transceiver 4 via antenna 5. One or more processors 6 within the UE 1 control the processing of the digital video data via instructions stored in the memory or data storage device 2.

Through experimentation and mathematical analysis it was determined that an efficient configuration using lossless coding and a Walsh-Hadamard Transform (WHT) to produce coefficients output from the WHT block can be utilized with statistical models associated with the number of non-zero positions for coding pulse vectors in an ensemble of vectors. As such, embodiments use a modified version of FPC, which is referred to herein as Video FPC for video, in a new manner that takes advantage of the probabilities associated with the video coded macro blocks and/or sub blocks. Embodiments use the transformed and quantized macro blocks and/or sub blocks (i.e., the pulse vectors) in a new way such that Video FPC can be used in a non-uniform way where the probabilities are not uniformly distributed over different frames of data, as explained in more detail below.

It was determined by the inventors that FPC, with additional changes, could be used for coding and decoding video data in a manner that requires less bandwidth than other video coding and decoding techniques previously used.

Figure 2:
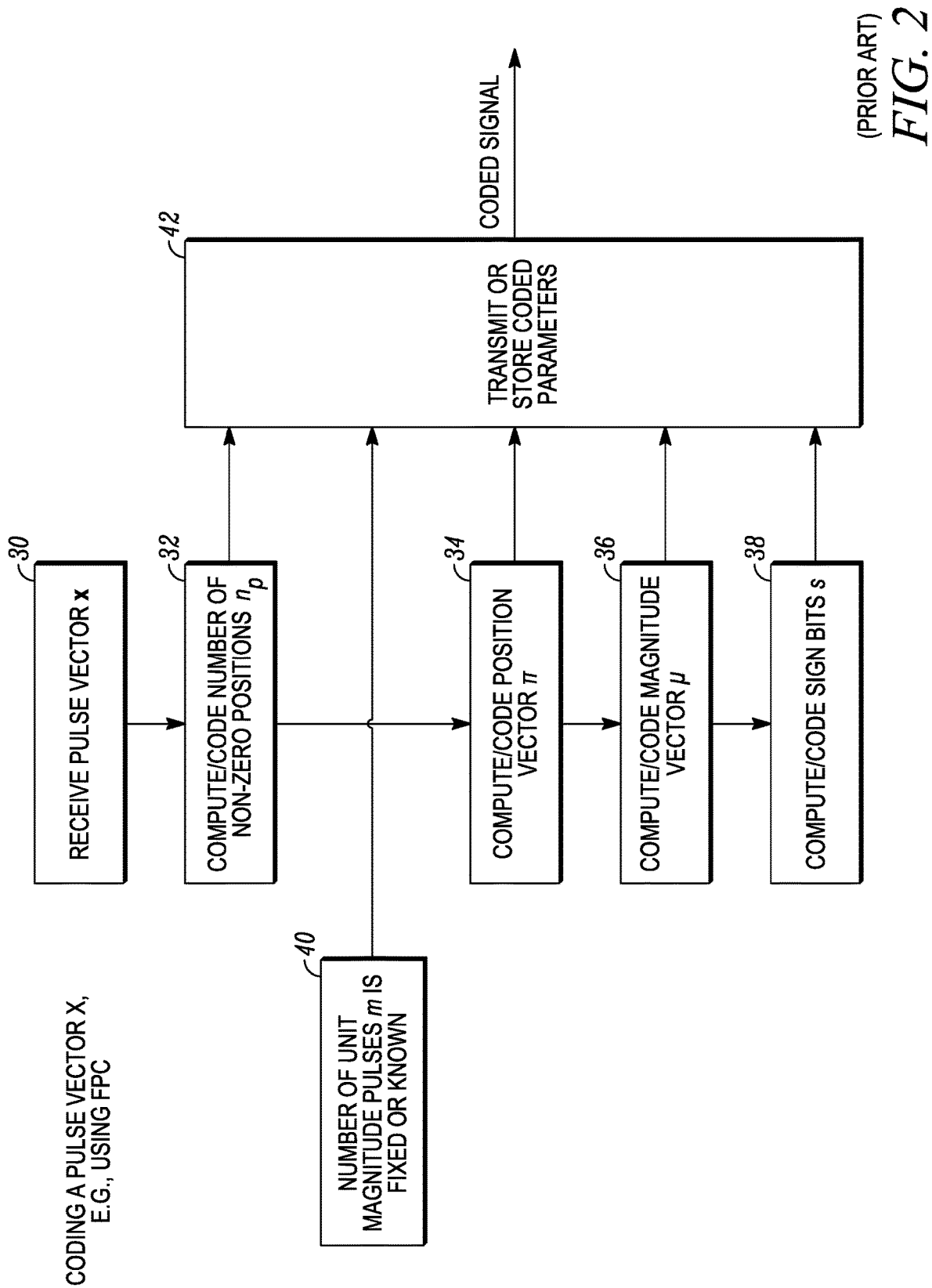
FIG. 2 is a flow diagram showing a prior art method for coding a quantized pulse vector that does not include using probability models.

FIG. 2 is a flow diagram of a prior art method of coding a single pulse vector x. This prior art method uses an encoding technique referred to as factored pulse coding (FPC). FPC is discussed to some degree in U.S. Pat. No. 8,149,144 for audio coding. In this method a single quantized pulse vector x is received at step 30. At step 32 the number of non-zero positions $n_p$ is computed and coded. Since the number of unit magnitude pulses is fixed or already known in this prior art method in block 40, this information does not have to be calculated. At step 34, the positions of each non-zero pulse within the pulse vector is coded as a position vector π. At step 36, the magnitude of each non-zero pulse within the pulse vector is coded as a magnitude vector µ. Finally, the sign of each non-zero pulse within the pulse vector is coded at step 38. Then, at step 42, the values/vectors output from each of the steps 32 through 40 and combined as coded parameters representing an original quantized pulse vector x, which is then transmitted or stored as a coded signal (i.e., a coded bit stream). It is important to note that if FPC is used for video encoding, no statistical analysis is performed by FPC on groups of the quantized pulse vectors $x_k$, where k is a whole number between 1 and the number of quantized pulse vectors sub blocks representing one video frame. The results of each of the steps 32 through 38 are essentially coded numbers that correlate directly to the pulse vector from which they were calculated. For example, in step 32, the number of non-zero positions in the quantized pulse vector is can be a positive integer number between 0 and the maximum number of pixels in the micro block, which in this example there are 16 possible locations in a 4×4 sub block. Additionally, for example, the position vector π, may indicate that, for example, positions 2, 5, 6, 7 and 8 of the quantized pulse vector (having positions 0 through 15) are non-zero values. Although this prior art method of coding a quantized pulse vector may save some data space and enable a higher data rate for audio signals, the prior method is limited and as will be discussed below is improved such that it can be used with variable length coding of video information.

Additional research was performed to investigate example embodiments using the novel VFPC rate estimates in a VP9 video codec. VP9 is a video codec standard used by Google, but it is understood that various video codec methods and systems can be used with embodiments of the invention. It was found that embodiments decrease the bandwidth or bit rate of the video data that is necessary or required to recreate the video sub block, macro block and ultimately the video frames. Thus, embodiments enable a lower bandwidth or bit rate necessary to transmit and receive video signals without degradation of the decoded recreated video images displayed on a UE 1 or other display device.

The type of information that is contained in transform block 18's output quantized signal vector or pulse vector x of a WHT or DCT transform was carefully considered. The serial string of quantized coefficients quantized that can be output of the transform (block 18) is a series of pulses or pulse vectors that essentially encodes the video signal in the frequency domain. Each pulse sample in the series of pulses or pulse vector has an integer magnitude and a sign (+/−). There are also a number of non-zero pulses within each pulse vector. That is, as discussed above with respect to equation (1) the quantized output of the transform block 18, $x=\{x_0, x_1, K, x_{n-1}\}$ is a quantized signal vector containing integer values, n is the vector length, and m is the total number of unit magnitude "pulses" within vector x, such that all vector elements are within the range $-m \le x_i \le m$.

In, for example, a study performed on the integration of the FPC bit rate estimates in a VP9 video codec wherein the lossless mode of the VP9 video codec was used and where a Walsh-Hadamard transform (WHT) was used to code 4×4 pixel blocks that were scanned to form a set of 16 element pulse vectors. The scanned WHT coefficients were coded using various FPC variations of which one configuration embodiment is discussed herein below.

For VP9, the inventors found that there were statistical biases in the resulting pulse vectors. Additionally, statistical biases were discovered in the pulse vectors created by other video codecs. It is expected that there are also statistical biases in other video codec outputs such as Daala, VP8, Indeo, Windows Media Video (WMV), QuickTime H264 as well as in other video codecs. Thus, many of the same VFPC methods that are shown to be used herein with VP9 can also be used and will apply to other types of video codecs. It is noted that the "number of unit magnitude pulses" cannot be reused with VP9 as, for example, it could be done in other video codecs like a Daala codec. Thus, when using a video codec such as VP9, the parameter m, being the total number of unit magnitude pulses within the vector x, should be explicitly coded in or with the vector. After several iterations of experiments using different coding configurations, it was discovered that a very good video coding configuration in accordance with an embodiment included number 1 and at least one more of the following:

1. Coding the number of non-zero transform elements using range coding;
2. Coding the total number of unit magnitude pulses using conditional (state driven) bitwise arithmetic coding;
3. Coding the transform coefficient position locations using adaptive arithmetic coding;
4. Coding the transform coefficient magnitudes using a method of probability-based combinatorial coding; and
5. Coding the corresponding sign information using bit wise arithmetic coding.

It was found that by using the above Video FPC coding configuration, which includes the use of statistical analysis in the coding process, there was about a 3.5% to about a 4.0% coding gain over the default VP9 methods (for lossless mode). In other words, by using a coding configuration that includes number 1 and one or more of the coding elements 2 through 5 results in a coded video output 27 of the Video FPC encoder 29 that required about 3.5% to 4.0% less data to code the video signal as the default VP9 coding method, yet still retain the same video image quality when decoded. In order to easily compare the length of encoded data, and determine the coding gain, the rate-distortion (R-D) optimization function in the encoder was disabled. This is important because the R-D optimization is matched to the default quantization method in VP9. If a different encoding method is used, then there is an inherent mismatch between the R-D optimization and actual encoding, and the compression performance would suffer. It is noted that in order to establish a more fair comparison, one would have also optimized the R-D function for the FPC methods used, but that is beyond the scope of this discussion. It should also be understood that embodiments can operate properly regardless of whether a R-D optimization function in the encoder is used or is disabled, and that the R-D function was only enabled for comparison purposed.

Figure 3:
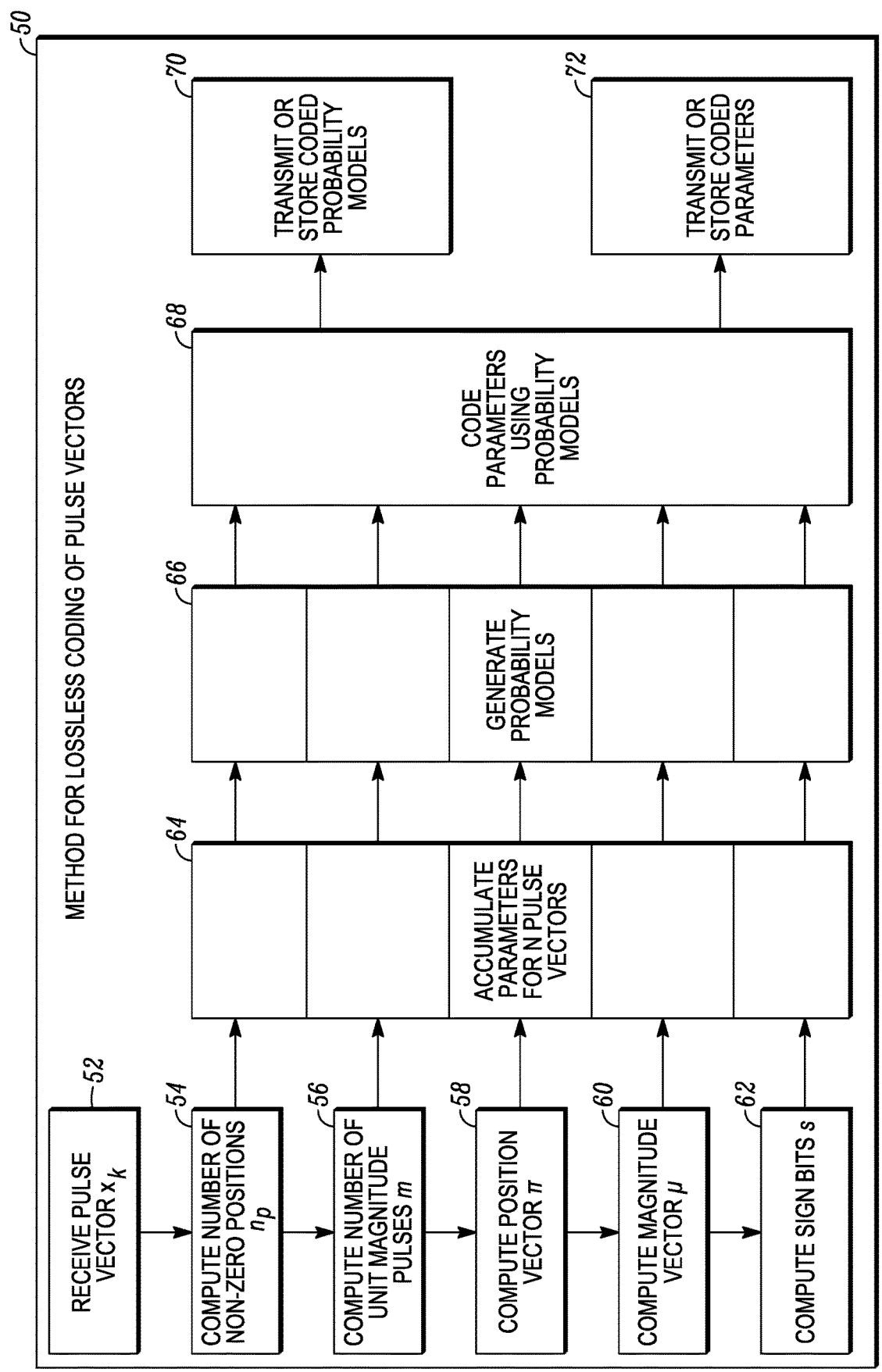
FIG. 3 is a flow diagram describing a flow process of an encoder embodiment that encodes quantized pulse vectors.

Referring now to FIG. 3, a flow chart 50 is presented to describe example encoding methods that utilize statistical models (i.e., probability models) for an ensemble of pulse vectors to more efficiently code the ensemble of pulse vectors. In some embodiments, at least one pulse parameter describing the non-zero pulses of a given pulse vector is encoded using the statistical models and the number of non-zero pulse positions for the given pulse vector. Such encoding methods may be performed by an encoder such as Video FPC encoder 26 in FIG. 1.

Referring again to FIG. 3, one such example encoding method will next be described. At step 52, a pulse vector $x_k$ of the ensemble of pulse vectors is received by the Video FPC encoder 26 from a transform block 18 or other block in which such pulse vectors may be generated or stored (if previously generated). At step 54 the number of non-zero pulse positions $n_p$ in the pulse vector $x_k$ is computed. At step 56 the number of unit magnitude pulses $m_k$ in the pulse vector $x_k$ is computed (although in some embodiments, as described below, a related quantity $m'_k$ may be computed). The number of unit magnitude pulses $m_k$ may also be viewed as a sum of magnitudes of the non-zero pulse positions of the pulse vector $x_k$. At step 58 a position vector $\pi_k$ is computed which includes location information for each non-zero pulse position in the pulse vector $x_k$. An example position vector $\pi_k$ includes a sequence of values indicating the position number of each non-zero pulse position of the pulse vector $x_k$. At step 60 a magnitude vector $\mu_k$ is computed which includes magnitude information for each non-zero pulse position in the pulse vector $x_k$. An example magnitude vector $\mu_k$ includes a sequence of values indicating the absolute magnitude of each non-zero pulse position of the pulse vector $x_k$, and omits any zero-valued positions. Lastly, at step 62 the sign information (i.e., algebraic sign) for each non-zero position of the pulse vector $x_k$ is computed and a corresponding sign vector $s_k$ is generated. Each of these parameters $n_p$, $m_k$, position vector $\pi_k$, magnitude vector $\mu_k$, and sign vector $s_k$ may be viewed as a respective pulse parameter describing non-zero pulse positions within the respective pulse vector $x_k$ of the ensemble of pulse vectors.

The above steps 52, 54, 56, 58, 60, 62 are repeated for every pulse vector $x_k$ of the ensemble of N pulse vectors. Such an ensemble of N pulse vectors may represent an entire video frame being evaluated (i.e., each pulse vector $x_k$ corresponding to a sub-block of the video frame). At step 64 each of the respective pulse parameters generated in steps 54 through 62 are accumulated for each respective pulse vector vector $x_k$ of the ensemble of N pulse vectors. At step 66 probability models are calculated for the accumulated pulse parameters for all N pulse vectors of the ensemble. Examples of such probability models are described in greater detail below. At step 68 the respective pulse parameters for each pulse vector $x_k$ are coded into corresponding codewords of a respective vector codeword set. At least one of the pulse parameters for each respective pulse vector $x_k$ is coded based on the probability models for the ensemble and also based on the respective number of non-zero positions in the respective pulse vector $x_k$. In some examples, the respective pulse parameter $n_p$ is coded based on the probability models for the ensemble of pulse vectors. In some examples, one, or more than one, or all of the respective parameters $m_k$, position vector $\pi_k$, magnitude vector $\mu_k$, and sign vector $s_k$ are coded based on the probability models for the ensemble and also based on the respective number of non-zero positions in the respective pulse vector $x_k$. Example methods of coding each of these different pulse parameters are described in greater detail below.

At step 72 the respective vector codeword set (i.e., the statistically coded pulse parameters for the number of non-zero positions, the number of unit magnitude pulses, the positions vector, the magnitude vector, and the sign bits) for each respective pulse vector $x_k$ of the ensemble, which also may be viewed as a coded bitstream, is transmitted or stored. Such a coded bitstream may be subsequently decoded by a decoder to reconstruct the ensemble of pulse vectors (e.g., as part of decoding a video signal represented by the coded bitstream). Referring back to FIG. 1, such a bitstream may be stored in memory storage 2, and may be transmitted using transceiver 4 and antenna 5. Other storage blocks and transmission blocks are also contemplated.

Since decoding the coded pulse parameters requires knowledge of the probability models used to code such pulse parameters, the probability models for each ensemble of pulse vectors is also coded at step 68 into one or more corresponding codewords of a statistical model codeword set (i.e., the coded probability models) for the ensemble. At step 70, this statistical model codeword set is transmitted or stored, for subsequent use by a decoder to reconstruct each pulse vector of the ensemble of pulse vectors. It should be noted that a respective vector codeword set (i.e., the statistically coded pulse parameters for the number of non-zero positions, the number of unit magnitude pulses, the positions vector, the magnitude vector, and the sign bits) is generated, then transmitted or stored, for each respective pulse vector (e.g., video sub-block) of the ensemble, but the statistical model codeword set (i.e., the coded probability models) are generated for the entire ensemble, and need only be transmitted or stored once per ensemble (e.g., video frame). Since each video frame usually includes a large number of sub-blocks, and since the coded probability models are transmitted relatively infrequently compared to the coded pulse parameters, the particular method used to code the probability models does not have a significant influence on the total number of bits required to code a given video frame, and such coding need not require significant compression.

In one example embodiment, a method for coding an ensemble of pulse vectors includes receiving the ensemble of pulse vectors, and determining, for each respective pulse vector of the ensemble of pulse vectors, a respective plurality of pulse parameters describing non-zero pulse positions within the respective pulse vector. One of the respective plurality of pulse parameters corresponds to a number of non-zero pulse positions within the respective pulse vector. The example method further includes generating a set of statistical parameters for the ensemble of pulse vectors, and coding the set of statistical parameters to produce a statistical model codeword set corresponding to the ensemble of vectors. For each respective pulse vector of the ensemble of pulse vectors, the example method further includes coding the pulse parameter corresponding to the number of non-zero pulse positions within the respective pulse vector to produce a first codeword of a respective vector codeword set; and coding at least one of a remaining plurality of pulse parameters describing non-zero pulse positions within the respective pulse vector, based upon the number of non-zero pulse positions within the respective pulse vector and the set of statistical parameters for the ensemble, to produce at least one corresponding codeword of the respective vector codeword set.

In one example embodiment, a system for coding an ensemble of pulse vectors includes a first buffer, for example in an encoder block, operable to receive the ensemble of pulse vectors, and a processor, as depicted in FIG. 1. The processor is operable to determine, for each respective pulse vector of the ensemble of pulse vectors, a respective plurality of pulse parameters describing non-zero pulse positions within the respective pulse vector. One of the respective plurality of pulse parameters corresponds to a number of non-zero pulse positions within the respective pulse vector. The processor is further operable to generate a set of statistical parameters for the ensemble of pulse vectors, and to code the set of statistical parameters to produce a statistical model codeword set corresponding to the ensemble of vectors. The processor is further operable, for each respective pulse vector of the ensemble of pulse vectors, to code the pulse parameter corresponding to the number of non-zero pulse positions within the respective pulse vector to produce a first codeword of a respective vector codeword set, and to code at least one of a remaining plurality of pulse parameters describing non-zero pulse positions within the respective pulse vector, based upon the number of non-zero pulse positions within the respective pulse vector and the set of statistical parameters for the ensemble, to produce at least one corresponding codeword of the respective vector codeword set.

Decoding such a coded bitstream is computationally less difficult, since it is not necessary to generate the probability models. Rather, the decoder receives the coded probability models for each ensemble from a coded bitstream, then decodes the coded probability models to generate the probability models for the ensemble (e.g., video frame). The decoder also receives each set of coded pulse parameters from the coded bitstream, then uses the probability models to decode the corresponding pulse parameters for each respective pulse vector of the ensemble, and determine each of the non-zero pulse positions within each respective pulse vector of the ensemble using the corresponding pulse parameters.

In one example embodiment, a method for decoding a coded bitstream to reconstruct an ensemble of pulse vectors includes receiving from the coded bitstream a statistical model codeword set, and decoding the statistical model codeword set to determine a set of statistical parameters corresponding to the ensemble of pulse vectors. The example method further includes receiving from the coded bitstream respective vector codeword sets corresponding to respective pulse vectors of the ensemble. For each respective vector codeword set, the example method further includes decoding a first codeword of the respective vector codeword set to determine a first pulse parameter corresponding to a number of non-zero pulse positions within a corresponding respective pulse vector; decoding at least a one of a remaining plurality of codewords of the respective vector codeword set, using the set of statistical parameters for the ensemble and the number of non-zero positions within the corresponding respective pulse vector, to determine at least one of a remaining plurality of pulse parameters describing the non-zero pulse positions within the corresponding respective pulse vector; and determining each of the non-zero pulse positions within the corresponding respective pulse vector of the ensemble using the respective plurality of pulse parameters.

In one example embodiment, a system for decoding a coded bitstream to reconstruct an ensemble of pulse vectors includes a first buffer and a processor. The first buffer is operable to receive from the coded bitstream a statistical model codeword set, and respective vector codeword sets corresponding to respective pulse vectors of the ensemble. The processor is operable to decode the statistical model codeword set to determine a set of statistical parameters corresponding to the ensemble of pulse vectors. The processor is further operable, for each respective vector codeword set, to decode a first codeword of the respective vector codeword set to determine a first pulse parameter corresponding to a number of non-zero pulse positions within a corresponding respective pulse vector; to decode at least a one of a remaining plurality of codewords of the respective vector codeword set, using the set of statistical parameters for the ensemble and the number of non-zero positions within the corresponding respective pulse vector, to determine at least one of a remaining plurality of pulse parameters describing the non-zero pulse positions within the corresponding respective pulse vector; and to determine each of the non-zero pulse positions within the corresponding respective pulse vector of the ensemble using the respective plurality of pulse parameters.

Referring now to each of the individual five steps used for encoding a video signal's pulse vectors $x_k$, the first step in this part of the encoding process of an embodiment is the coding of the number of non-zero elements $n_p(k)$ for each vector $x_k$. To code the number of nonzero elements $n_p(k)$ for each vector $x_k$, the following is performed at step 54, where:

$$n_p(k) = \sum_{i=0}^{n-1} \begin{cases} 1, & x_k(i) \neq 0 \\ 0, & \text{otherwise} \end{cases}, 0 \leq k < N. \quad (1.1)$$

For this expression, n is the length of the pulse vector $x_k$, which for a 4×4 block size, is 16. In order to effectively range code $n_p(k)$, the probabilities P of a particular non-zero element $n_p(k)$ occurring are calculated, which can be expressed as:

$$P_n(j) = \frac{1}{N} \sum_{k=0}^{N-1} \begin{cases} 1, & n_p(k) = j \\ 0, & \text{otherwise} \end{cases}, 1 \leq j < n, \quad (1.2)$$

where N is the number of vectors (blocks) in the ensemble of vectors being evaluated (for example, corresponding to the number of blocks in a frame), $n_p(k)$ is the number of non-zero positions in the k-th vector (block), and j is the bit index of the pulse vector $x_k$. From these expressions, the number of bits per block $M_p$ for encoding $n_p(k)$ can be estimated as:

$$M_p = -\sum_{j=0}^{n-1} P_n(j) \log_2 P_n(j). \quad (1.3)$$

At step 68, this information is used to explicitly code $n_p(k)$ using range coding.

Another step, being the coding of the unit magnitude pulses contained in each of the pulse vectors $x_k$ of step 56 will now be discussed. This method for coding the number of unit magnitude pulses contained in the each vector $x_k$ uses a conditional bitwise arithmetic coding. Similar to other steps in this embodiment, first a number of unit magnitude pulses $m_k$ in vector $x_k$ (where all values of $x_k$ are signed integers) of length n is calculated as:

$$m_k = \sum_{i=0}^{n-1} |x_k(i)|, 0 \leq k < N. \quad (1.4)$$

Next the bitwise probabilities of each bit of $m_k$ being set to one are calculated. In a generalized bitwise (a.k.a. binary) arithmetic coding (BAC) scheme, the following expression yields the bitwise probabilities:

$$P_m(j) = \frac{1}{N} \sum_{k=0}^{N-1} \begin{cases} 1, & m_k \& 2^j \neq 0 \\ 0, & \text{otherwise} \end{cases}, 0 \leq j < N_b, \quad (1.5)$$

where $N_b$ is the maximum number of bits to be coded, j is the bit index, $m_k$ is the number of unit magnitude pulses for the k-th vector (block), and N is the total number of vectors (blocks) to be coded, for example, in a frame or macro block. Also, the "&" symbol represents the bitwise AND operator. For the above expression, $P_m(j)$ represents the probability that the j-th bit position of the value $m_k$ is set to one. This probability can be used to losslessly code the array of $m_k$ values for use in signal compression.

However, since it is already known what the number of occupied positions $n_p(k)$ contained in $x_k$ (from step 54 discussed above), then the redundancy between these two quantities can be exploited. For example, $n_p(k)$ can never be greater than $m_k$ because if there is only one pulse at each of the occupied positions, then $m_k=n_p(k)$. So if $m_k$ is always equal to $n_p(k)$, and $n_p(k)$ is known, then there is no need to code $m_k$ for this case because the probability that $m_k=n_p(k)$ is 100%. So in order to exploit this property, then initially the "pulse quantity offset" $m'_k=m_k-n_p(k)$ should be coded, so that some of the correlation between $m_k$ and $n_p(k)$ is removed.

Secondly, advantage is taken of a more direct correlation that exists between $m'_k$ and $n_p(k)$. That is, when fewer positions are occupied (i.e., $n_p(k)$ is small relative to n), there is a corresponding increased probability that $m'_k$ will be relatively small, and conversely, when more positions are occupied, there is an increased probability that $m'_k$ will be relatively large. This relationship can be exploited by generating binary arithmetic coding (BAC) probability tables for each corresponding value of $n_p(k)$, such that:

$$P(n_p(k), j) = \frac{c_1(n_p(k), j)}{c_2(n_p(k))}, 0 \leq k < N, 0 \leq j < N_b \quad (1.6)$$

where $c_1(n_p(k), j)$ is the number of times the j-th bit of the number of pulses $m'_k$ parameter is set (for a given $n_p(k)$), $n_p(k)$ is the number of non-zero positions in $x_k$, and $c_2(n_p(k))$ is the number of instances in which $x_k$ contains $n_p(k)$ non-zero positions. The expression defines an n×$N_b$ size matrix that gives the probability of a particular bit of $m'_k(i)$ being set for a given predetermined number of occupied positions $n_p(k)$. The above process is shown in in flow chart form in FIG. 4 for clarity.

Figure 4:
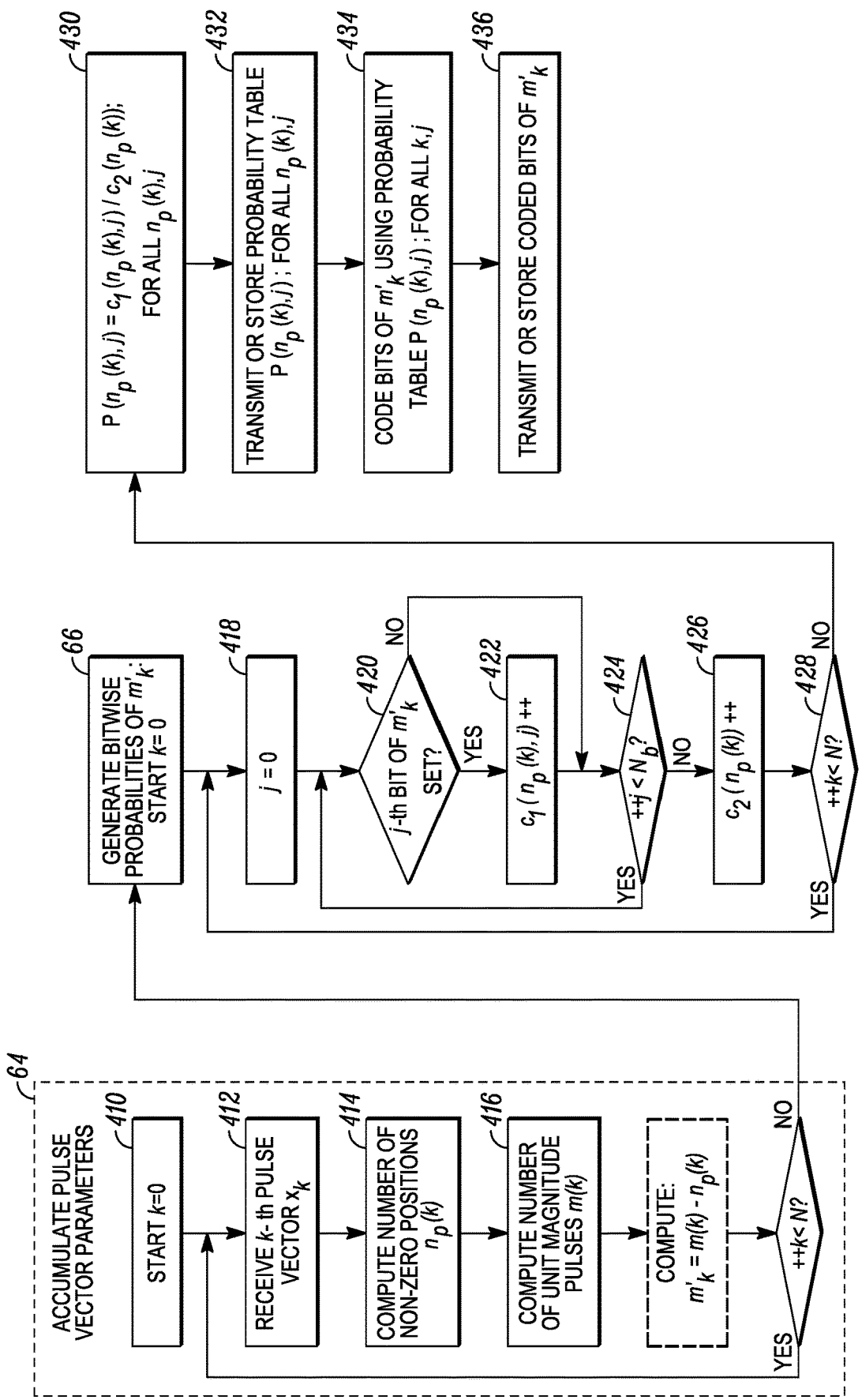
FIG. 4 is a flow diagram providing detail about a process of coding a pulse count of a quantized pulse vector.

In FIG. 4, step 64 is operable to accumulate all of the pulse vector parameters in a given frame for the value of k ranging from a value of 0 to N. The value of k is initiated at a null value at a block 410 and then proceeds to a block 412 to receive the k-th pulse vector $x_k$ and then to block 414 to calculate the non-zero positions and onto a block 416 to compute the number of unit magnitude pulses for that particular vector. Once the non-zero positions and the number of unit magnitude pulses have been calculated for a particular pulse vector, the value of k is tested against the value of N to determine if the frame has been completed. If not, the process loops to block 412. If so, then the process flows from the step 64 to the next process to generate the probability models, this being step 66 from FIG. 3.

In step 66, the bit wise probabilities of $m'_k$ is calculated over the entire frame with the value of k ranging from a value of 0 to N. For a given pulse vector $x_k$, there is provided a computed value $m'_k$ representing the number of unit magnitude pulses for the given pulse vector $x_k$. The process is initialized at the "0" for the j-th bit at block 418, and then proceeds to test each bit in $m'_k$. The decision block 420 determines if the currently tested bit is set. If so, this indicates a non-zero bit and the process flows to block 422 to calculate the value $c_1(n_p(k),j)$ and then proceeds to a decision block 424 to determine if the value of j is less than the value of $N_b$. If not, the process flows back to the input of decision block 420. If the currently tested bit was not set, the process would bypass block 422. This in essence counts the number of bits "set" in $m'_k$. After the number of bits set in a particular vector are determined, the program then flows to a block 426 to calculate $c_2(n_p(k))$ for the number of instances in which $x_k$ contains $n_p(k)$ non-zero positions and then to a block 428 in order to perform this test for all pulse vectors $x_k$ in the frame. Once this process is performed over the entire frame, this provides the bit wise probabilities of $m'_k$ and the process flows to a block 432 to build the table in accordance with equation 1.6 above and then proceeds to a block 432 wherein the table is transmitted or stored and into a block 434 to code the bits of $m'_k$ using the probability table for all k, j. The coded bits of $m'_k$ are then transmitted or stored with other statistically coded bits, as indicated by block 436.

Thirdly, it was observed that the correlation among particular bits of $m'_k$ depends to a large degree on the position of the most significant bit within $m'_k$. That is, if the number of coded bits $N_b$ is generally large compared to the pulse offset quantities $m'_k$ to be coded, i.e., $2^{N_b} \gg m'_k$, then the correlations are very high since the leading (most significant) bits of $m'_k$ tend to have probabilities of zero. Conversely, as $m'_k$ values become large relative to the number of bits coded, i.e., $2^{N_b} \approx m'_k$, then the bit probabilities become more random in the least significant bits. To take advantage of this property, a state machine is introduced which allows discrimination between most significant bits (which have a higher probability of being zero), and least significant bits (which have more random probabilities). By calculating the probabilities separately for the different states, the overall performance is dramatically improved.

Figure 5:
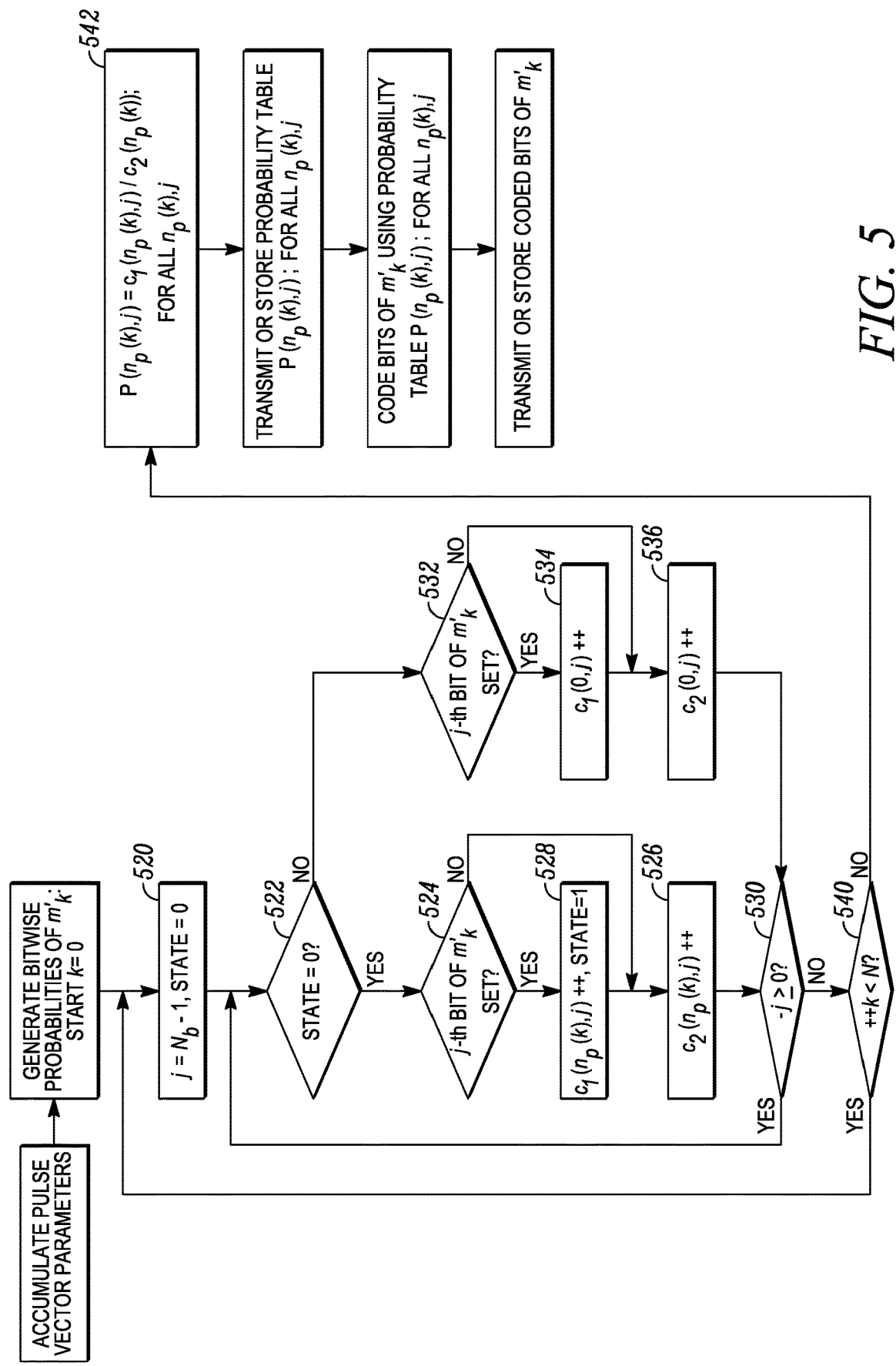
FIG. 5 is a flow diagram providing additional detail about the process of coding the pulse count of a quantized pulse vector that includes state processing.

FIG. 5 provides one example of a flow chart of how a state machine can be employed in an embodiment. Here the pulse vectors are accumulated and bitwise probabilities of $m'_k$ are performed as discussed above and shown in FIG. 4. In this FIG. 5, there are provided two states, a state 0 representing bits not being set and a state 1 indicating the occurrence of a first bit being set. The bits are tested from the MSB to the LSB, taking advantage of the fact that large values of $m'_k$ will have a large number of bits not set in the upper portion of the digital word. Thus, the state is initially set at state 0 in block 520 and to the first j-th bit of $m'_k$ (the MSB Nb−1) in this state. Thereafter, the process flows to the decision block 522 in order to determine if the state is still state 0. The state will be state 0 until the first j-th bit tested is set. As long as this bit has not been set, the program will flow along the path from decision block 522 to block 524 to determine if this tested bit is set. This is the point where the state changes from state 0 to state 1. As long as the tested bit is not set, the process will remain in state 0 and the process will merely calculate $c_2(n_p(k))$ as noted in block 526. However, if the tested bit is set, this indicates that the state operation must change to state 1. This will result in the process flowing from block 524 to block 528 in order to calculate the value of $c_1(n_p(k),j)$ and then set the state to 1 and then flow to block 526. The process will flow to a decision block 532 and potentially loop back to decision block 522. If the state had changed to state 1, the program will flow to another decision block 532 from decision block 522 for the process similar to that of FIG. 4. This will flow to a block 534 and is done in order to calculate $c_1(n_p(k),j)$ and then onto a block 536 to calculate $c_2(n_p(k))$ if the bit is set. The process will bypass block 534; if the j-th bit is not set to state 1. The process then flows to decision block 530 and continues until all bits have been tested for j. The program then flows to a decision block 540 to loop back around to the input of block 524 until all additional pulse vectors in the frame are handled and then proceeds to perform the same functions as set forth above with respect to blocks 430-436.

From FIG. 5, notice that a full probability table is not illustrated for state 1 as it is for state 0. For state 0, the table $P(n_p(k), j)$ spans the range $1 \leq n_p(k)$ n and $0 \leq N_b$. For state 1, only an additional $N_b-1$ memory locations are required because of the inherent randomness across all state 1 bits. Therefore, the additional probabilities for state 1 are accessed by simply utilizing the zero-th row of the $P(n_p(k), j)$ probability matrix, which now has the dimension $0 \leq n_p(k) \leq n$ and $0 \leq N_b$, and where the state 1 probabilities are stored at the P(0, j) elements.

Table 1 shows the relative performance gains of the described methods compared to traditional scalar and binary arithmetic coding (using know probability models).

TABLE 1

Comparison of coding methods for lossless compression of the 'm' parameter in 4 × 4 WHT blocks (360 frames, original content resolution 352 × 288)

| | | Luminance | Chrominance |
|---|---|---|---|
| Vector statistics | Average number of non-zero positions $n_p$ | 12.408 | 10.073 |
| | Average number of unit magnitude pulses m | 87.4 | 29.2 |
| | Maximum number of unit magnitude pulses $m_{max}$ | 1528 | 655 |
| Coding rate (average bits per block) | Simple scalar quantization | 11 | 10 |
| | Traditional binary arithmetic coding (BAC) | 7.611 | 6.011 |
| | BAC + (m − $n_p$) coding | 7.246 | 5.132 |
| | +Conditional BAC | 6.449 | 4.452 |
| | +State driven CBAC | 6.350 | 4.393 |
| | Conditional BAC | 6.800 | 5.042 |
| | +State driven CBAC | 6.515 | 4.742 |
| | +(m − $n_p$) coding | 6.350 | 4.393 |

The step of coding of position information (step 58 of FIG. 3) involves using binary arithmetic coding to convey whether or not an element of the quantized vector $x_k$ contains non-zero information. The overall probability of a given element within the quantized vector is comprised of the conditional probability of the i-th position element being non-zero, given that the number of the j remaining non-zero elements lie the range i to n−1. That is, since it is known in advance that there are $n_p$ non-zero positions in the length n vector $x_k$, then it is also known that if $n_p$−j non-zero positions have been coded in the first i possible positions, then there are j non-zero positions left to be coded over the remaining n−i positions. This can significantly change the overall probabilities across the quantized pulse vector $x_k$, especially if the probability distribution is non-uniform. Thus, it is required that the associated probabilities needed for binary arithmetic coding are adapted on a position-by-position basis. The description below outlines a low complexity method for performing this task in a very computationally efficient manner.

Figure 7:
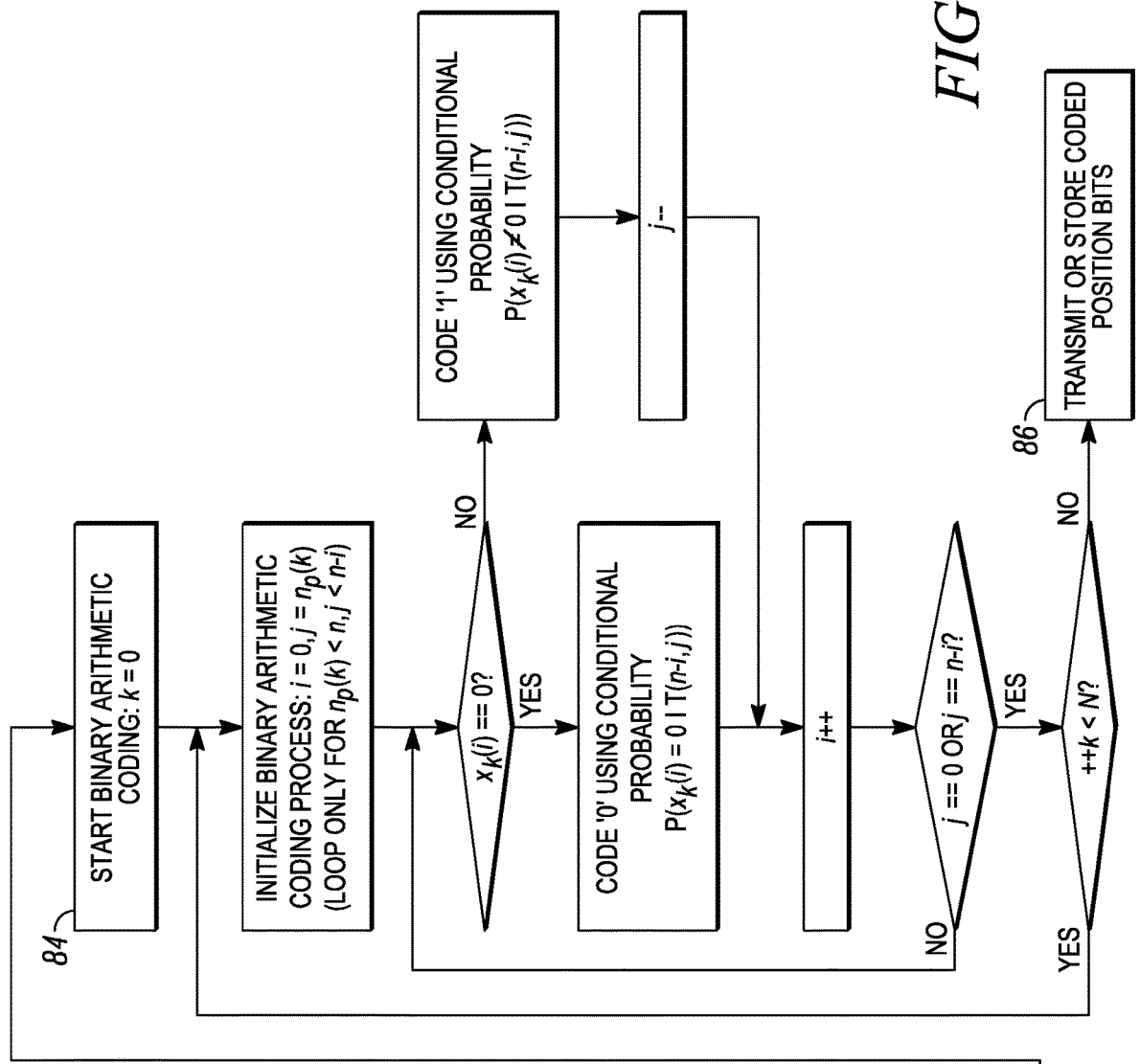
FIG. 7 is a flow diagram providing detail about a process for coding quantized pulse vector pulse position information.

Referring to FIG. 7, a flow diagram that provides detail of an example process for coding quantized pulse vector pulse position information is provided. At step 64 the parameters for each k vector $x_k$ are accumulated as already discussed in FIG. 4. Then in steps 72, 74 and 76, for each vector $x_k$ the probability of the i-th position or element of input vector $x_k$ being occupied by a non-zero value is determined based on the equation:

$$P(x_k(i)) = \frac{1}{N} \sum_{k=0}^{N-1} \begin{cases} 1, & x_k(i) \neq 0 \\ 0, & \text{otherwise} \end{cases}, 0 \leq i < n, \quad (1.7)$$

where N is the total number of vectors in the probability ensemble (e.g., the frame or portion of a frame,) and n is the vector length. Next, if the probability of j non-zero values falling on the remaining n−i positions of vector $x_k$ is set to be P(T(n−i,j)), then the overall probability can be denoted as P($x_k$(i)|T(n−i,j)). Again, this is the probability of element $x_k$(i) being non-zero, given j non-zero valued elements over the remaining n−i positions of vector $x_k$. In some embodiments the probability of the i-th element of input vector $x_k$ being occupied by a non-zero value is determined by the encoder block via probability calculations, while in other embodiments, these probabilities are received from functional blocks associated with the encoder block.

In order to calculate the conditional probabilities, the probability combinations of future coded elements are examined, based on previously coded elements, and their associated probabilities are aggregated in order to adjust the probabilities of the remaining quantized vector elements to be coded. Now we define the probability matrix P(T) as:

$$P(T) = \begin{bmatrix} P(T(0,0)) & 0 & 0 & \cdots & 0 \\ P(T(1,0)) & P(T(1,1)) & 0 & \cdots & 0 \\ P(T(2,0)) & P(T(2,1)) & P(T(2,2)) & \cdots & 0 \\ \vdots & \vdots & \vdots & \ddots & \vdots \\ P(T(n,0)) & P(T(n,1)) & P(T(n,2)) & \cdots & P(T(n,n)) \end{bmatrix}, \quad (1.8)$$

where the matrix elements P(T(i, j)) represent the probabilities from using a trellis matrix of having j non-zero elements on the remaining i positions of vector $x_k$. Further, the matrix elements can be defined as:

$$P(T(0,0))=1, \quad (1.9a)$$

$$P(T(1,0))=1-P(x_k(n-1)), \quad (1.9b)$$

$$P(T(1,1))=P(x_k(n-1)), \quad (1.9c)$$

$$P(T(2,0))=(1-P(x_k(n-1)))\cdot(1-P(x_k(n-2))), \quad (1.9d)$$

$$P(T(2,1))=P(x_k(n-1))\cdot(1-P(x_k(n-2)))+(1-P(x_k(n-1)))\cdot P(x_k(n-2)), \quad (1.9e)$$

$$P(T(2,2))=P(x_k(n-1))\cdot P(x_k(n-2)), \quad (1.9f)$$

and so on. As may be apparent, a recursive relationship can be formed as follows:

$$P(T(2,0))=(1-P(x_k(n-2)))\cdot P(T(1,0)), \quad (1.10a)$$

$$P(T(2,1))=P(x_k(n-2))\cdot P(T(1,0))+(1-P(x_k(n-2)))\cdot P(T(1,1)), \quad (1.10b)$$

$$P(T(2,2))=P(x_k(n-2))\cdot P(T(1,1)), \quad (1.10c)$$

which can be generalized as:

$$P(T(i,j)) = \begin{cases} (1-P(x_k(n-i)))\cdot P(T(i-1,j)) & j=0 \\ P(x_k(n-i))\cdot P(T(i-1,j-1))+(1-P(x_k(n-i)))\cdot P(T(i-1,j)), & 1 \leq j \leq i, \ 0 \leq i \leq n. \\ P(x_k(n-i))\cdot P(T(i-1,j-1)) & j=1 \end{cases} \quad (1.11)$$

Figure 6:
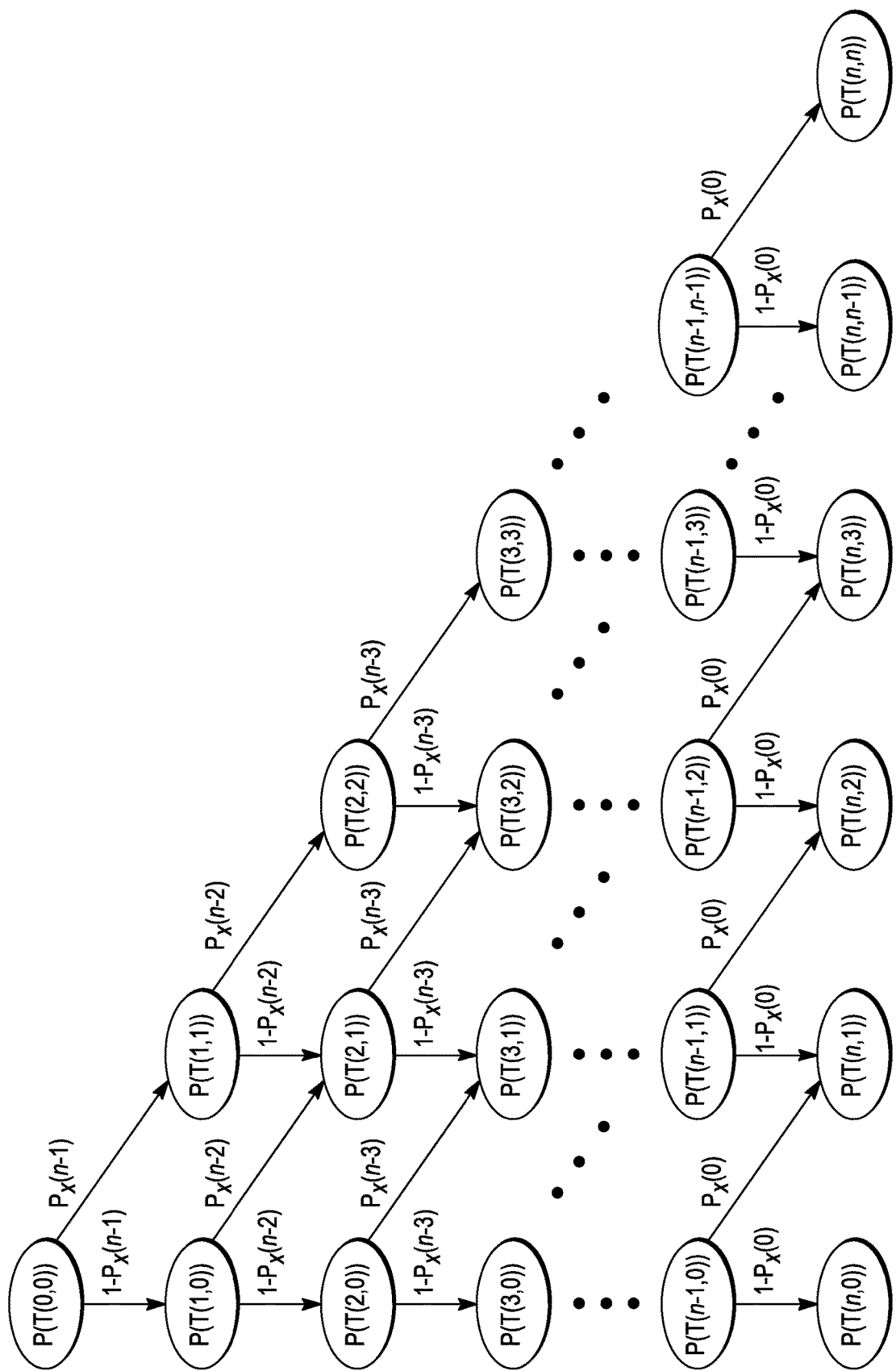
FIG. 6 provides a trellis flow diagram that explains a recursive process used in an embodiment to determine conditional probabilities.

For a pictorial representation of the recursive process given above, see the trellis diagram in FIG. 6. At step 80 and 82, in some embodiments, the probabilities P($x_k$(i)) may be sorted in descending order and a trellis matrix with matrix elements P(T(i, j)). At step 84 binary arithmetic coding is initiated with k=0.

Now, the joint probability is determined: P($x_k$ (i)≠0|T(n−i,j)). By applying Bayes' Theorem to this expression, we get:

$$P(x_k(i) \neq 0 \mid T(n-i,j)) = \frac{P(T(n-i,j) \mid x_k(i) \neq 0)\cdot P(x_k(i))}{P(T(n-i,j))}, \quad (1.12)$$

where it is implied that P($x_k$(i)≠0)=P($x_k$(i)). From this expression, the trellis diagram of FIG. 6 is used to infer that P(T(n−i,j)|$x_k$(i)≠0)=P(T(n−i−1,j−1)), and then substituted into the previous equation to get:

$$P(x_k(i) \neq 0 \mid T(n-i,j)) = \frac{P(T(n-i-1,j-1))\cdot P(x_k(i))}{P(T(n-i,j))}. \quad (1.13)$$

From here, it can be understood that the ratio P(T(n−i−1,j−1))/P(T(n−i,j)) depends only on constant index offsets, i.e., n−i→n−i−1, and j→j−1, therefore, a huge computational savings can be had by pre-computing the ratios:

$$T'(n-i,j) = \frac{P(T(n-i-1,j-1))}{P(T(n-i,j))}, \quad (1.14)$$

$$0 \leq i < n, 1 \leq j < n-i$$

and thereby reducing the per vector probability computations to:

$$P(x_k(i) \neq 0 | T(n-i,j)) = T(n-i,j) \cdot P(x_k(i)) \quad (1.15a)$$

and $$P(x_k(i)) = 0 | T(n-i,j)) = 1 - T(n-i,j) \cdot P(x_k(i)) \quad (1.15b)$$

These simple straight forward equations 1.15a and 1.15b are then used by the binary arithmetic coding process shown in the flow loops between step 84 and 86 in FIG. 7.

It is noted that the flow diagram of FIG. 7 shows a dotted box showing sorting of probabilities $P(x_k(i))$ 80. The number of bits needed to code the non-zero positions will not change whether the probabilities are sorted or not. However, there are two advantages of sorting the probabilities: a) a shorter trellis diagram, i.e., the starting positions where $P(x_k(i))=1$ and ending positions where $P(x_k(i))=0$ can be removed from the trellis diagram, and (b) the sorting increases the chances of early termination of the second loop shown in FIG. 7.

TABLE 2

Comparison of methods for position coding in 4 × 4 WHT blocks (360 frames, lossless compression, original content resolution 352 × 288)

| | | Luminance | Chrominance |
|---|---|---|---|
| Vector statistics | Average number of non-zero positions $n_p$ | 12.408 | 10.073 |
| Coding rate (average bits per block) | FPC position coding | 7.231 | 10.064 |
| | Adaptive conditional arithmetic coding | 6.667 | 9.388 |

For the purpose of coding the magnitude components of vector $x_k$, (FIG. 3), steps 60, 64, 66, and 68) the magnitude vector of length $n_p(k)$ is defined as:

$$x' \equiv \{|x_k| > 0\}, \quad (1.16)$$

such that $x' \equiv \{x'_0, x'_1, \ldots, x'_{n_p-1}\}$ are the absolute values of all the non-zero elements of vector $x_k$ having a length n.

Figure 8:
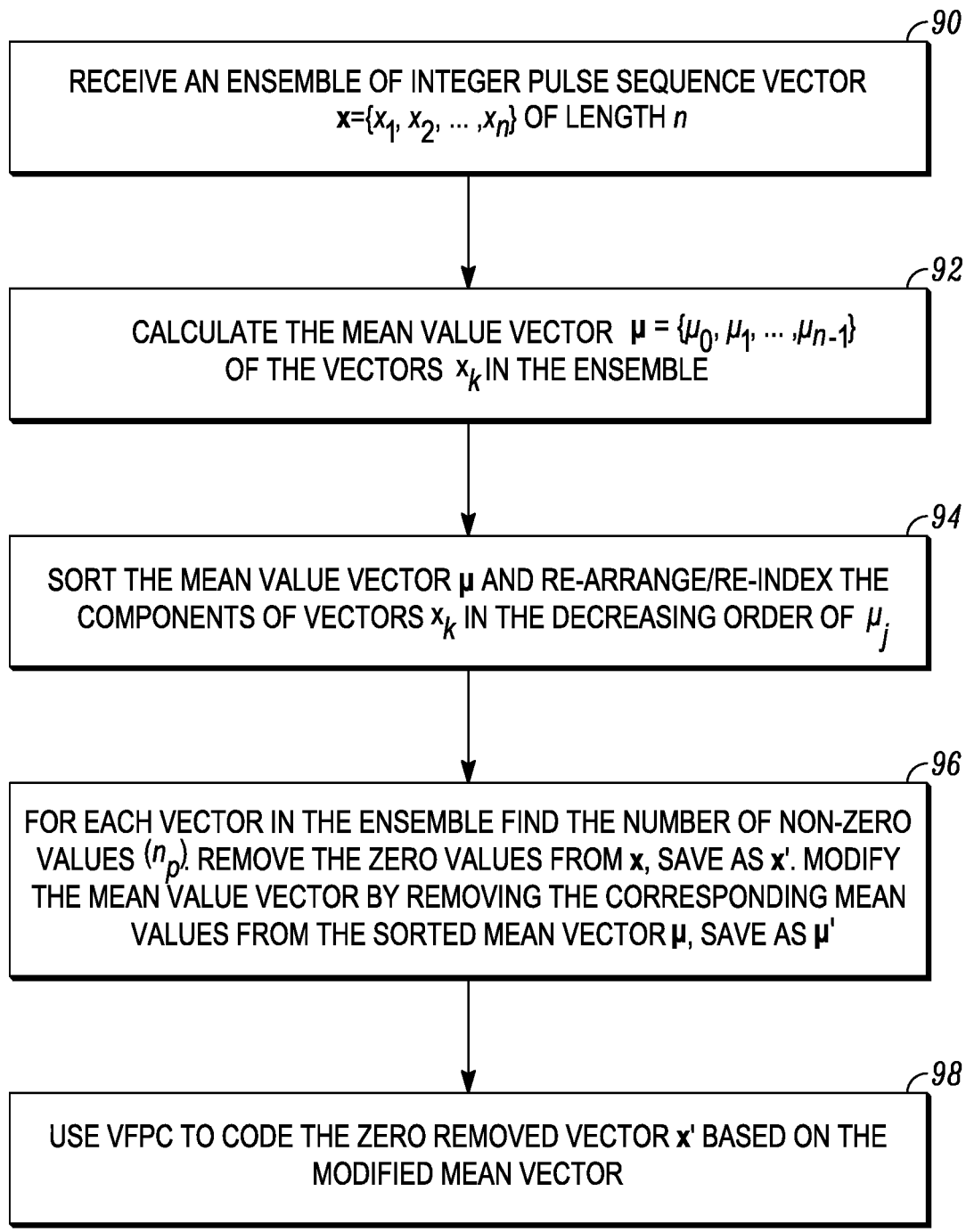
FIG. 8 is a flow diagram providing an overview of the sequence of steps used for VPCC coding magnitudes of the quantized pulse vector non-zero positions.

Referring for a moment to FIG. 8, a simplified overview flow chart describing coding of the magnitude vectors $x_k$ is shown. At step 90 an ensemble of integer pulse sequence vectors (i.e., pulse vectors $x_k$ for an entire frame or block is provided having a length n. At step 92, a mean value vector $\mu = \{\mu_0, \mu_1, \mu_2, \ldots, \mu_{n-1}\}$ of the vectors $x_k$ in the ensemble is calculated. Then at step 94 the mean value vector $\mu$ is sorted such that the components of the vectors $x_k$ are re-arranged or re-indexed in, for example memory of the UE, in a decreasing order of mean value vector $\mu$.

At step 96 for each vector in the ensemble, the number of non-zero values ($n_p$) is determined and all the zero values are removed from the $x_k$ vector. The resulting vector x' is then saved. Additionally, the mean value vector $\mu$ is modified by removing the corresponding mean values from the sorted mean vector $\mu$ and save the result $\mu'$. Then at step 98, use VPFC to code vector with the zeros removed x' based on the modified mean value vector $\mu'$.

Figure 9:
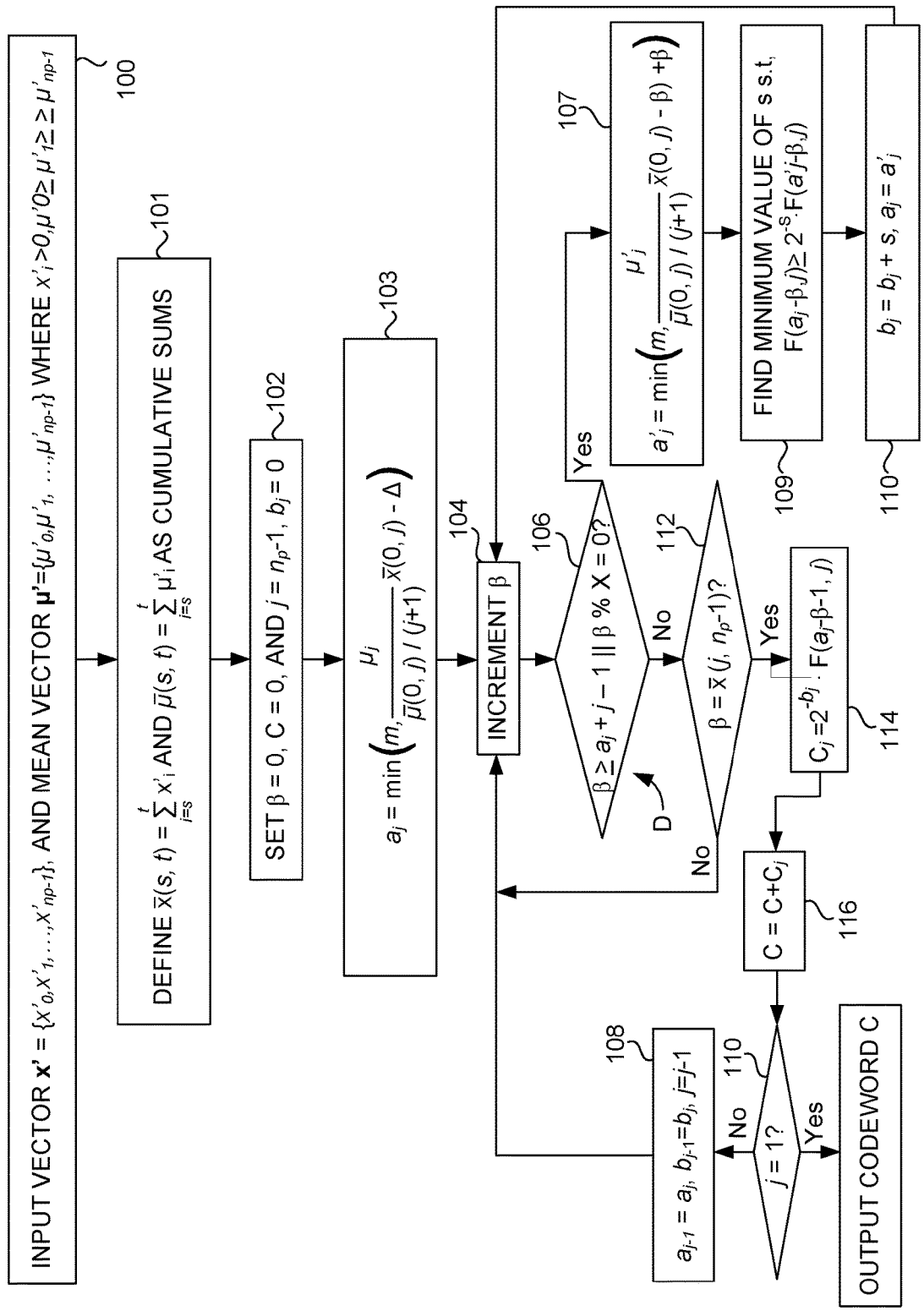
FIG. 9 is a flow diagram providing detailing a process for coding mean value vectors using variable factorial pulse coding (VFPC) to create an output codeword representing a coded pulse vector $x_k$.

For a more in-depth understanding of an example method of coding the magnitude components of vector $x_k$ using probability-based combinatorial coding the following is provided and shown in a flow diagram in FIG. 9. That is, in step 100, the magnitude vector of length $n_p(k)$ is defined as:

$$x' \equiv \{|x_k| > 0\}, \quad (1.16)$$

such that $x' \equiv \{x'_0, x'_1, \ldots, x'_{n_p-1}\}$ are the absolute values of all the non-zero elements of vector $x_k$ having a length n.

Then in an embodiment using the novel VFPC method, the k-th codeword resulting from coding the magnitude vector x' is given by:

$$C = \sum_{j=1}^{n_p(k)-1} F\left(\left(\sum_{i=1}^{j} x'_i\right) - 1, j\right) \quad (1.17)$$

where F(m,j) is the combinatorial expression given in Eq. 3. The corresponding length (in bits) of the magnitude codeword (from Eq.4) is then given by:

$$L = \log_2(F(m_k-1, n_p(k)-1)) \quad (1.18)$$

where $m_k$ and $n_p(k)$ are the number of unit magnitude pulses and number of non-zero vector elements, respectively, for vector index k, as defined and discussed above.

Note that for a given $n_p(k)$, the length of the codeword is dependent only on $m_k$ and does not depend on the individual elements of x'. A mean absolute vector is defined as:

$$\mu_i = \frac{1}{N} \sum_{k=0}^{N-1} |x_k(i)|, 0 \leq i < n \quad (1.19)$$

where, as also discussed above, N is the number of vectors (or scanned video blocks) per frame, and n is the vector length. It can be statistically inferred that if all $x_k(i)$ are independent and identically distributed (i.i.d.), then their respective expected absolute values are equivalent, and that their sampled mean absolute values $\mu_i$ are approximately equal. However, if the mean absolute values $\mu_i$ are significantly different across all values of $0 \leq i < n$, then all possible combinations of the magnitude vector x' (and therefore, the codeword (C)) are not equally likely. In this case, the bits for coding C are not fully utilized, and are therefore not 100% efficient. To circumvent this problem, the length of the combinatorial codeword C should be smaller for vectors that are more likely, and should be larger for vectors that are less likely. The following describes a method for accomplishing this objective.

To generate a combinatorial codeword C whose length is dependent on the configuration of the magnitude vector x', the codeword can be generated by a combinatorial coding method that is also dependent on the expected values or mean values $\mu_i$. Without loss of generality, the magnitude vector is arranged such that the $\mu_i$ are in decreasing order i.e., $\mu_0 \geq \mu_1 \geq \ldots \geq \mu_i \geq \ldots \geq \mu_{n-1}$. If they are not already arranged in decreasing order, then one can first sort $\mu_i$, and then re-arrange or re-index the $x_k(i)$ components such that their mean values are in the decreasing order. At this point, it is very likely that the initial few components of $x_k$ will have higher values, i.e., $x_k(0)$, $x_k(1)$, etc., as well as a higher probability of being greater than the last few components. To advantageously use this property, the magnitudes are coded using an adaptive combinatorial coding approach, which generates a variable length codeword. This approach is novel and has been named by the inventors as Variable Factorial Pulse Coding (VFPC).

In a novel VFPC approach, the magnitude codeword for VFPC is obtained as:

$$C = \sum_{j=1}^{n_p-1} 2^{-b_j} \cdot F\left(\sum_{i=0}^{j-1} x'_i - 1 - m + a_j, j\right), \quad (1.20)$$

where $a_j \leq m$ (defined as the adaptive pulse count) and $b_j$ (defined as the adaptive shift count) are obtained adaptively based on the partially coded vector and the sampled absolute mean values. If $a_j=m$ and $b_j=0$, then this expression is equivalent to Eq.1.17. As we typically start coding with $j=n_p-1$, and work down to $j=1$, (and then rearranging the terms on the right) we get:

$$C = \sum_{j=n_p-1}^{1} 2^{-b_j} \cdot F\left(a_j - 1 - \sum_{i=j}^{n_p-1} x'_i, j\right). \quad (1.21)$$

So we will now describe a process for adapting $a_j$ and $b_j$ using some function of the sampled absolute mean values $\mu_i$, such that the average length of codeword C is reduced.

Here at step 101, the functions are defined as:

$$\bar{x}(s,t) = \sum_{i=s}^{t} x'_i \text{ and } \bar{\mu}(s,t) = \sum_{i=s}^{t} \mu'_i, \quad (1.22)$$

where s and t define the start and end components of the sub-vectors to be analyzed. In the following expression, the functions are used to generate the adaptive pulse count $a_j$ as:

$$a_j = \min\left(m, \frac{\mu'_j}{\bar{\mu}(0,j)/(j+1)} \bar{x}(0,j) - \Delta\right), \quad (1.23)$$

where $\Delta$ is a fixed pre-determined positive constant. In the above equation, $\mu'_j$ corresponds to the mean absolute value for the j-th element of vector x'. That is, the vector $\mu'$, which was also determined and input from the accumulated parameters for N pulse vectors in step 100 with vector x', contains the values of vector $\mu$ that correspond to the non-zero elements of vector $x_k$. In experimentation, $\Delta=3$ was chosen. One of ordinary skill in the art may choose other values for $\Delta$ in various embodiments of VPFC. It should be noted that when all values of $\mu'$ are equal then $a_j$ in Eq.1.23 is equal to $m-\Delta$. However, for optimum performance of some embodiments, $a_j$ should be m. In this example scenario of an embodiment (when all mean values are equal), it is preferable to choose $\Delta=0$.

It can be observed that if we have sorted absolute means, i.e., $\mu'_0 \geq \mu'_1 \geq \ldots \geq \mu'_{n_p-1}$, then:

$$\frac{\mu'_j}{\bar{\mu}(0,j)/(j+1)} \leq 1. \quad (1.24)$$

Hence from Eq.1.23, it can be seen that $a_j \leq m-\Delta$. This result is significant because it is desirable to code the magnitudes in a way that makes the total number of unit magnitude pulses appear to be smaller when the expected absolute mean value of a position is lower than the average.

As shown in the flow chart of FIG. 9 at step 102, to adapt the values of $a_j$ and $b_j$, an embodiment initializes $\beta=0$, and $b_j=0$. Also at this step, the codeword C is set to 0 and the bit index j is initialized at the first bit location. At step 103, $a_j$ is calculated using equation 1.23. $\beta$ is then incremented at step 104 followed by the values of $a_j$ and $b_j$ being modified when $\beta$ is at certain pre-defined values and/or when $\beta=a_j-j+1$ at step 106). When $\beta$ is within the certain predefined values, at step 107, the modified value $a'_j$ is now obtained as:

$$a'_j = \min\left(m, \frac{\mu'_j}{\bar{\mu}(0,j)/(j+1)}(\bar{x}(0,j) - \beta) + \beta\right). \quad (1.25)$$

It can be verified that $a'_j \geq a_j$.

For obtaining a modified value $b'_j$, a minimum value s is found at step 109 such that $$F(a_j-\beta,j) \geq 2^{-s} \cdot F(a'_j-\beta,j) \quad (1.26)$$

Here $b_1=b_1+s$ is set, and $a_j$ and $b_1$ are replaced by their modified values at step 110 wherein the process loops back to step 104. Note that the inequality condition in Eq.1.26 of step 109 guarantees that the coding process is still uniquely decodable, and that selecting a minimum value of s will minimize the increase in the number of coded bits.

When at step 106, $\beta$ is not with the predefined values, then at step 112 is determined whether $\beta=\bar{x}(j,n_p-1)$. If this is not true the process flows back to step 104 where $\beta$ is incremented. If this is true, then at step 114 the combinatorial contribution for the magnitude x'(j) is generated as:

$$C_j = 2^{-b_j} \cdot F(a_j-\beta-1,j) \quad (1.27)$$

At step 116 C is made equal to $C+C_j$. And, until j=1 at step 110, the value of j is decreased and the values of $a_{j-1}$ and $b_{j-1}$ are now set equal to $a_j$ and $b_j$ at step 108. Then for all subsequent values of j, Eq.1.25 and Eq.1.26 are still used for the modifying the values of $a_j$ and $b_j$. When j=1 at step 110, the final combinatorial codeword C is obtained from step 116 as a summation of respective combinatorial contribution $C_j$:

$$C = \sum_{j=1}^{n_p-1} C_j \quad (1.28)$$

The length of the final codeword is given by:

$$L = b_1 + \log_2(F(a_{n_p-1}-1, n_p-1)) \quad (1.29)$$

Since $b_1$ is not fixed and is dependent on the coded sequence and the mean value vector, the method generates a variable length codeword. The corresponding decoder process is complementary to the encoder process.

Figure 10:
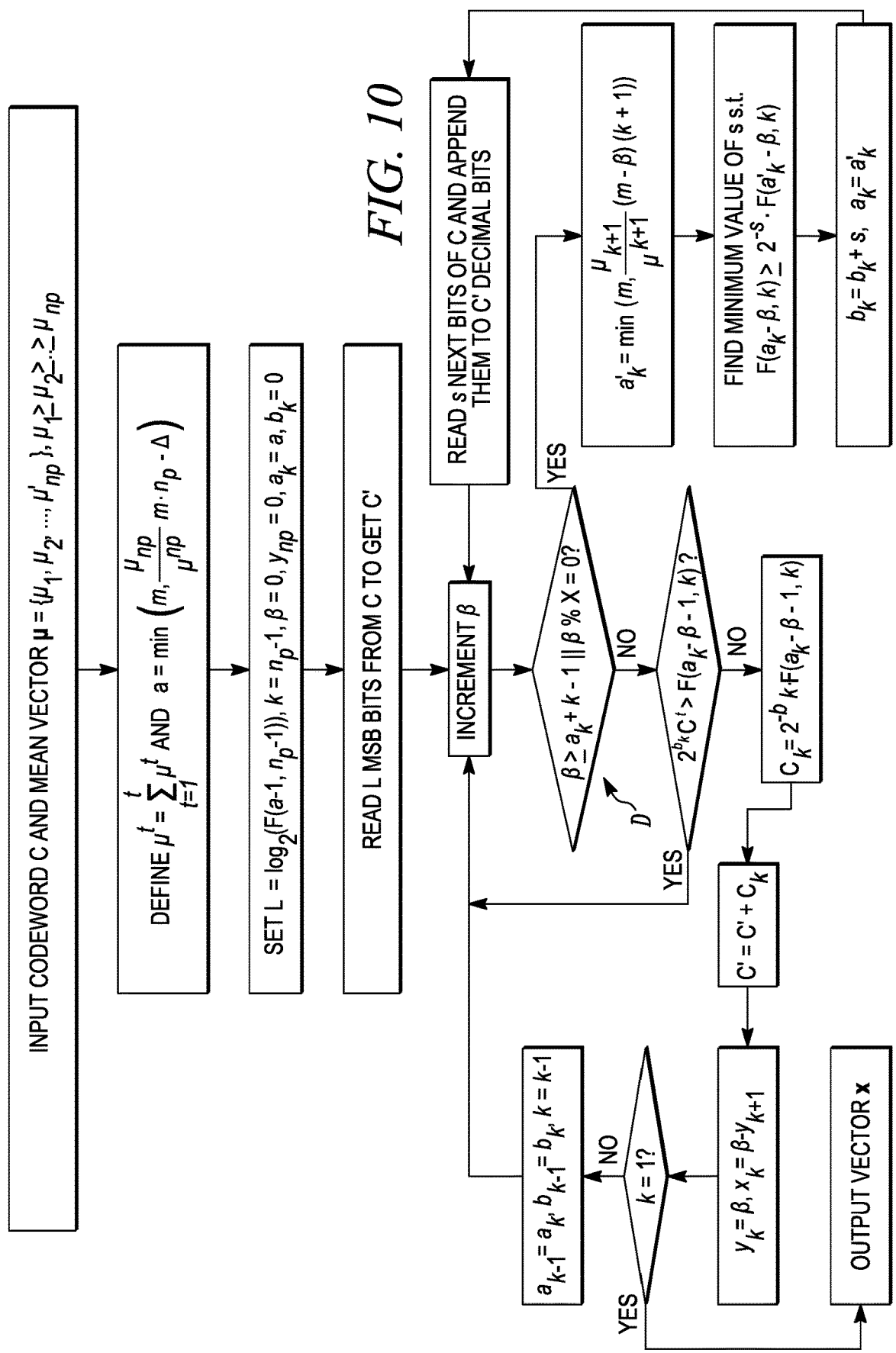
FIG. 10 is a flow diagram detailing a process for decoding a code word in accordance with an embodiment to recreate the quantized pulse vector $x_k$.

At this point it is important to understand that a combinatorial coding method generating a variable length codeword has been described. Additionally, it should be understood that the codeword length and the codeword are dependent on the mean absolute values of the vector to be coded. Additionally, FIG. 10 provides a flowchart showing VFPC decoding steps in accordance with an embodiment of the invention. FIG. 10 is easily understood by one of ordinary skill in the art after understanding the workings of FIG. 9.

When the mean values are fixed and are known a-priori, the method of FIG. 9 can be directly used. However, in many real world applications, the mean value also needs to be computed and transmitted. For example, in video coding applications, the mean values of the coefficients $x_k(i)$ of macro-blocks (vector $x_k$) may change from frame to frame or may be different depending on the type of macro-block (Luma or Chroma). In such scenarios, to make optimum use of the various embodiments, the mean values are calculated and can be transmitted in each frame of the coded video.

In another embodiment, the computation of mean value also makes use of the fact that the input to VFPC encoder (see FIG. 9) is a vector whose components are non-zero and hence it may be better to restrict the mean calculation over only those components of the quantized vector x that are non-zero. Thus, defining $x_k(i)$ as the i-th component of the vector $x_k$ and $c_i$ as the count of i-th component being non-zero over all the vectors $x_0$ to $x_{N-1}$, i.e., $$c_i = \sum_{k=0}^{N-1} I_{(x_k(i) \neq 0)} \quad (1.30)$$

where $I_q$ is an indicator function which is 1 if q is true otherwise it is 0, where q is the value of $x_k(i) \neq 0$. The mean value of the i-th component can now be computed as:

$$\mu_i = \frac{1}{c_i} \sum_{k=0}^{N-1} |x_k(i)| \quad (1.31)$$

Either Eq.1.31 or Eq.1.19 can be used to calculate the absolute mean values $\mu_i$. The mean values thus computed may be quantized (scalar quantization) and transmitted or stored once per frame (see FIG. 3, step 70).

To compare the performance of an embodiment of a variable length FPC (VFPC) method to a regular prior art FPC method, the VFPC method for coding of macro-blocks representing the Walsh-Hadamard Transform (WHT) coefficients of size 4×4 was integrated into VP9 codec operating in lossless mode (See FIG. 1).

Additionally, in order to compare the VFPC video encoding embodiment as a stand alone coding method for coding of the magnitudes, a random vector $x=\{x_0, x_1, \ldots, x_{n-1}\}$ of length n=16 whose components $x(i) \geq 0$ were independent with absolute mean values $\mu_i = g_0 \cdot \gamma^{(i-1)}$, where $\gamma \leq 1$, was first generated. Note that when $\gamma=1$, all the components $x(i)$ have identical mean values. The VFPC embodiment was used for coding the magnitudes of non-zero components of pulse vector x in a simulation. In the Table 3 the results of the VFPC magnitude coding method is compared with the regular FPC magnitude coding method.

TABLE 3

Showing comparison average number of bits needed by VFPC vs. Regular FPC for coding magnitudes with components mean values $\mu_i = g_0 \cdot \gamma^{(i-1)}$

| g0 | γ | FPC Bits | VFPC Bits |
|---|---|---|---|
| 25 | 0.70 | 46.24 | 41.25 |
| 25 | 0.79 | 56.45 | 52.27 |
| 7.9 | 0.99 | 71.34 | 72.08 |

It can be seen that smaller the value of $\gamma$, the more skewed (away from being equal) the absolute mean values $\mu_i$ are and hence the greater the percentage code gain of VFPC when compared to regular FPC (9% for $\gamma=0.70$ in Table 3). However, when $\gamma \sim 1$ (i.e., 0.99), then using VFPC results in a slight loss. This is because in this embodiment the mean values are nearly equal and hence the regular FPC will perform at a nearly optimum level making it difficult for VFPC to outperform it. Another reason for VFPC not performing well for $\gamma=0.99$ is because $\Delta$ was set as $\Delta=3$ in equation (1.23), which does not tune the embodiment for coding when the distributions are identical.

For coding sign information (see FIG. 3 steps 62, 64, 66, and 68), existing methods for binary arithmetic coding can be used.

As such embodiments of the invention provide lossless coding (entropy coding) of blocks of prediction residual data in video coding after being transformed, quantized and mapped into one-dimensional vectors. Embodiments provide a UE that, via hardware and/or program instructions, uses a coding method that segregates video block data originating from a frame into the following units of information and then encodes the units of information efficiently using statistical models that are updated every frame. The units of information comprise a) determining the number of non-zero positions of a quantized pulse vector per block, where a block is a macro or micro block of the frame; b) summing the magnitudes (the absolute values) for the non-zero positions m of the quantized pulse vector; c) determining which positions within the quantized pulse vector have a non-zero magnitude; d) determining the absolute value magnitude of each non-zero position in the quantized pulse vector; and e) determining the sign of each magnitude at the non-zero positions in the quantized pulse vector.

The parameters for all the pulse vectors N in the frame are then accumulated. Next, probability models are generated for the frame and for each block unit of information within the frame. The probability models are used to encode the units of information (a through e) for each block of video data to produce encoded video data. In various embodiments the probability models are transmitted or stored, as needed, with each block unit of encoded video data so that the encoded video data can be decoded at a decoder.

The probability models encode the units of information using bitwise arithmetic coding (BAC) which calculates the probabilities for each non-zero bit in the pulse vectors to be coded to be 1 when the pulse vector is represented in binary in order to find model probabilities for the most efficient code length. Method encodes one set of occupied positions in pulse magnitude information from the pulse vector based on the number of non-zero positions and then sets statistical parameters using adaptive arithmetic coding. Additionally, bitwise arithmetic is used to encode each non-zero position. The statistical probabilities of each frame are adapted based on how many positions of the pulse vectors are occupied with non-zero values. Statistical probabilities are updated for each frame. The use of factorial pulse coding is utilized to generate codes for the magnitude of each non-zero position in a block based on factorial calculations. Fixed codeword lanes and codewords are produced for set of (n, m) values. Since video coding residual blocks are not i.i.d, like audio coding data, each frame block you have very different statistical parameters associated with average values and probabilities with respect to the number of, location of, magnitude of, position of and sign of each non-zero position of the pulse vectors.

Although it is understood that coding position information is well known, various novel encoder embodiments of the invention use arithmetic coding for simultaneous position and magnitude coding. Coding the last non-zero position is accomplished using a determination or "end of block" code. This new method uses a specialized version of arithmetic coding for coding positions where probabilities are adapted in each frame of data based on how many previously coded positions were occupied or unoccupied. The adapted probabilities are precomputed on a frame by frame basis via a trellis, which may be referred to as a "probability matrix" rather than using an explicit termination code, embodiments provide a process that completes when the number of non-zero positions are exhausted. Such embodiments provide lossless encoded video data they can be transmitted at a lower data rate or stored using less memory space than previous digital video encoding techniques.

It will be appreciated by those skilled in the art having the benefit of this disclosure that this method and system for coding pulse vectors using statistical properties provides improved methods for coding an ensemble of pulse vectors utilizing statistical models (i.e., probability models) for the ensemble of pulse vectors, to more efficiently code each pulse vector of the ensemble. In various embodiments, at least one pulse parameter describing the non-zero pulses of a given pulse vector is coded using statistical models and a number of non-zero pulse positions for the given pulse vector. In some embodiments, a number of non-zero pulse positions are coded using range coding. The total number of unit magnitude pulses may be coded using conditional (state driven) bitwise arithmetic coding. Non-zero pulse position locations may be coded using adaptive arithmetic coding. Additionally, non-zero pulse position magnitudes may be coded using probability-based combinatorial coding, and the corresponding sign information may be coded using bitwise arithmetic coding. Such embodiment methods and systems are well suited for coding non-independent-identically-distributed signals, such as coding video information. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A method comprising:
receiving a video frame using at least one processor;
generating an ensemble of pulse vectors using at least one processor, each of the pulse vectors corresponding to a portion of the video frame;
generating, using at least one processor, a statistical model codeword set for the ensemble of pulse vectors, wherein generating the statistical model codeword set comprises generating respective conditional probabilities for the pulse vectors in the ensemble, and wherein generating the respective conditional probabilities comprises using a bitwise arithmetic coding;
generating, using at least one processor, a set of vector codewords for the ensemble of pulse vectors, each of the vector codewords corresponding to a respective one of the pulse vectors, the set of vector codewords including magnitude vector codewords representing magnitudes of pulses in the respective pulse vectors, wherein the magnitude vector codewords in the set have lengths that depend on a configuration of the respective pulse vector, such that the length is smaller for the pulse vectors that are more likely, and larger for the pulse vectors that are less likely; and
transmitting the statistical model codeword set and the set of vector codewords using at least one processor for receipt by a decoder.

2. The method of claim 1, wherein generating the respective conditional probabilities for the pulse vectors in the ensemble further comprises determining probabilities that a position i in the respective pulse vector is a non-zero integer value, given that a number j of non-zero positions exist in the pulse vector in a range from i to n, where n is a length of the pulse vector.

3. The method of claim 1, wherein generating the respective conditional probabilities further comprises examining probability combinations of future coded elements based on previously coded elements, and aggregating associated probabilities so as to adjust probabilities of remaining elements of the pulse vectors to be coded.

4. The method of claim 3, wherein the respective conditional probabilities are generated using a probability matrix defined as:

$$P(T(i,j)) = \begin{cases} (1 - P(x_k(n-i))) \cdot P(T(i-1, j)) & j = 0 \\ P(x_k(n-i)) \cdot P(T(i-1, j-1)) + \\ (1 - P(x_k(n-i))) \cdot P(T(i-1, j)), & 1 \le j < i, 0 \le i \le n \\ P(x_k(n-i)) \cdot P(T(i-1, j-1)) & j = i \end{cases}$$

where $P(T(i,j))$ is a probability of having j non-zero elements on i remaining elements of the pulse vector, and $x_k(n)$ is an n-th element of a pulse vector $x_k$, the pulse vector $x_k$ having n elements.

5. The method of claim 3, further comprising pre-computing ratios of probabilities to reduce per-vector probability computations.

6. The method of claim 1, wherein generating the set of vector codewords comprises generating a k-th vector codeword as $$C = \sum_{j=1}^{n_p(k)-1} F\left(\left(\sum_{i=1}^{j} x_i'\right) - 1, j\right),$$

wherein
$n_p(k)$ is a number of non-zero positions in a k-th pulse vector;
$F(m,j)$ is a combinatorial expression for a number of combinations of j non-zero elements on m vector positions; and
$x_i'$ is an i-th element of a vector of absolute values of non-zero elements of the pulse vector.

7. The method of claim 1, wherein generating the set of vector codewords comprises taking into account how many non-zero positions exist in the respective pulse vector.

8. The method of claim 7, wherein generating the set of vector codewords comprises performing range coding with an estimated number of bits.

9. The method of claim 8, further comprising at least one selected from the group consisting of:
coding a total number of unit magnitude pulses in the pulse vectors using conditional bitwise arithmetic coding;
coding transform coefficient position locations using adaptive arithmetic coding;
coding a transform coefficient magnitudes using probability-based combinatorial coding; and
coding corresponding sign information using bitwise arithmetic coding.

10. The method of claim 8, wherein generating the set of vector codewords further comprises calculating probabilities of particular non-zero elements occurring, and estimating a number of bits per block using the calculated probabilities.

11. The method of claim 1, wherein generating the statistical model codeword set comprises generating at least one statistical model for the ensemble of pulse vectors, and wherein at least one of the vector codewords is coded based on the statistical model.

12. The method of claim 11, further comprising performing a decoding without again generating the at least one statistical model.

13. The method of claim 1, wherein generating the vector codewords comprises defining a pulse quantity offset.

14. The method of claim 13, further comprising performing bitwise arithmetic coding for a number corresponding to occupied positions in the respective pulse vector, and using the number corresponding to the occupied positions in defining the pulse quantity offset.

15. The method of claim 13, further comprising calculating probabilities for at least a most significant bit of the pulse quantity offset, and at least a least significant bit of the pulse quantity offset, separately from each other.

16. The method of claim 1, further comprising adapting, on a position-by-position basis, associated probabilities for binary arithmetic coding of the pulse vectors.

17. A system comprising:
a buffer operable to receive a video frame; and
a processor configured to execute instructions that cause the processor to perform operations including:
generating an ensemble of pulse vectors using at least one processor, each of the pulse vectors corresponding to a portion of the video frame;
generating, using at least one processor, a statistical model codeword set for the ensemble of pulse vectors, wherein generating the statistical model codeword set comprises generating respective conditional probabilities for the pulse vectors in the ensemble, and wherein generating the respective conditional probabilities further comprises examining probability combinations of future coded elements based on previously coded elements, and aggregating associated probabilities so as to adjust probabilities of remaining elements of the pulse vectors to be coded;
generating, using at least one processor, a set of vector codewords for the ensemble of pulse vectors, each of the vector codewords corresponding to a respective one of the pulse vectors, the set of vector codewords including magnitude vector codewords representing magnitudes of pulses in the respective pulse vectors, wherein the magnitude vector codewords in the set have lengths that depend on a configuration of the respective pulse vector, such that the length is smaller for the pulse vectors that are more likely, and larger for the pulse vectors that are less likely; and
transmitting the statistical model codeword set and the set of vector codewords using at least one processor for receipt by a decoder.

* * * * *